(12) United States Patent
Oh et al.

(10) Patent No.: US 10,084,030 B2
(45) Date of Patent: Sep. 25, 2018

(54) BACKPLANE SUBSTRATE AND ORGANIC LIGHT EMITTING DIODE DISPLAY USING THE SAME

(71) Applicant: LG Display Co., Ltd., Seoul (KR)

(72) Inventors: Kum-Mi Oh, Seoul (KR); Hye-Seon Eom, Daegu (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 15/581,763

(22) Filed: Apr. 28, 2017

(65) Prior Publication Data

US 2017/0317155 A1 Nov. 2, 2017

(30) Foreign Application Priority Data

Apr. 29, 2016 (KR) .................. 10-2016-0053476

(51) Int. Cl.
 *H01L 27/32* (2006.01)
 *H01L 49/02* (2006.01)

(52) U.S. Cl.
 CPC ...... *H01L 27/3265* (2013.01); *H01L 27/3246* (2013.01); *H01L 27/3258* (2013.01);
 (Continued)

(58) Field of Classification Search
 CPC . H01L 27/32; H01L 27/3246; H01L 27/3262; H01L 27/3265; H01L 27/3272; H01L 27/3276
 See application file for complete search history.

(56) References Cited

U.S. PATENT DOCUMENTS

2014/0291636 A1 10/2014 Kim et al.
2015/0060809 A1* 3/2015 Kim .................. H01L 51/5228
 257/40
(Continued)

FOREIGN PATENT DOCUMENTS

JP 2001-013893 A 1/2001
JP 2004-062179 A 2/2004
(Continued)

OTHER PUBLICATIONS

Office action dated Feb. 6, 2018 in a counterpart Japanese patent application No. JP 2017-090343.
(Continued)

*Primary Examiner* — Phuc Dang
(74) *Attorney, Agent, or Firm* — Polsinelli PC

(57) ABSTRACT

Disclosed are a backplane substrate which secures sufficient storage capacitance even when using small sub-pixels in a structure having very high resolution, and an organic light emitting diode display using the same. The backplane substrate includes storage capacitors including a first storage electrode, a second storage electrode partially overlapping the first storage electrode, a second storage connection electrode overlapping the first and second storage electrodes and connected to the second storage electrode at a first node, and a first storage connection electrode overlapping the second storage connection electrode and connected to the first storage electrode at a second node at which the first and second storage electrodes do not overlap each other, in a storage capacitor region defined by intersecting a scan line, a first voltage line and a data line at each sub-pixel.

41 Claims, 15 Drawing Sheets

(52) U.S. Cl.
CPC ...... *H01L 27/3262* (2013.01); *H01L 27/3272* (2013.01); *H01L 27/3276* (2013.01); *H01L 28/60* (2013.01)

(56) References Cited

U.S. PATENT DOCUMENTS

| | | | |
|---|---|---|---|
| 2015/0097172 A1* | 4/2015 | Han | H01L 27/3265 257/40 |
| 2015/0144892 A1 | 5/2015 | Chang et al. | |
| 2016/0064421 A1 | 3/2016 | Oh et al. | |
| 2016/0322445 A1* | 11/2016 | Lee | H01L 51/5253 |
| 2017/0124953 A1* | 5/2017 | Shim | H01L 27/3218 |

FOREIGN PATENT DOCUMENTS

| | | | |
|---|---|---|---|
| JP | 2007-013091 A | 1/2007 |
| JP | 2008-270759 A | 11/2008 |
| JP | 2014-232870 A | 12/2014 |
| JP | 2015-102867 A | 6/2015 |
| JP | 2016-027590 A | 2/2016 |

OTHER PUBLICATIONS

Office action dated Aug. 14, 2018 in a counterpart Japanese patent application No. JP 2017-090343.

* cited by examiner

BACKPLANE SUBSTRATE AND ORGANIC LIGHT EMITTING DIODE DISPLAY USING THE SAME

CROSS REFERENCE TO RELATED APPLICATIONS

This application claims the benefit of Korean Patent Applications Nos. 10-2016-0053476 filed on Apr. 29, 2016 and 10-2016-00127085 filed on Sep. 30, 2016, which are hereby incorporated by reference in their entirety.

BACKGROUND OF THE DISCLOSURE

Field of the Disclosure

The present disclosure relates to a backplane substrate, and more particularly, to a backplane substrate which provides sufficient storage capacitance even when using small sub-pixels in a structure having a very high resolution, and an organic light emitting diode display using the same.

Discussion of the Related Art

As various portable electronic devices, such as a mobile communication terminal, a notebook computer, etc., have been developed, requirements for flat panel display devices applied thereto have increased.

As representative examples of the flat panel display devices, liquid crystal displays (LCDs), plasma display panels (PDPs), field emission displays (FEDs), organic or inorganic light emitting diode displays (OLEDs), etc. have been researched. Particularly, among these flat panel display devices, application of an organic light emitting diode display is being increased due to advantages thereof, such as development of mass-production technology, ease in a driving means, a low power consumption, implementation of a large screen and flexibility.

The organic light emitting diode display includes a plurality of pixels provided in a matrix, each of the pixels has three or more sub-pixels, and the sub-pixel includes at least one thin film transistor (TFT) which may individually control each sub-pixel.

However, in a display device requiring high resolution, such as augmented reality or virtual reality, the display device having a restricted size should have a very high resolution and, thus, the size of individual pixels is gradually decreased. Further, in a display having light emitting diodes directly provided therein, such as an organic light emitting diode display, in order to selectively express gradation of individual sub-pixels, each small-sized sub-pixel should include at least 2 transistors and 1 capacitor (2T1C) and, in this case, it is difficult to implement a device having sufficient holding characteristics due to the small size of each sub-pixel and, thus, realistic gradation expression on a screen is impossible.

SUMMARY OF THE DISCLOSURE

Accordingly, the present disclosure is directed to a backplane substrate and an organic light emitting diode display using the same that substantially obviate one or more problems due to limitations and disadvantages of the related art.

The present disclosure is to provide a backplane substrate which may secure sufficient storage capacitance even when using small sub-pixels in a structure having very high resolution, and an organic light emitting diode display using the same.

Additional advantages and features of the disclosure will be set forth in part in the description which follows and in part will become apparent to those having ordinary skill in the art upon examination of the following or may be learned from practice of the disclosure. The other advantages of the disclosure may be realized and attained by the structure particularly pointed out in the written description and claims hereof as well as the appended drawings.

To achieve other advantages and in accordance with the purpose of the disclosure, as embodied and broadly described herein, a backplane substrate for an organic light emitting display device includes a substrate including a plurality of sub-pixels, a scan line disposed in a first direction at each sub-pixel, a first voltage line and a data line disposed in a second direction intersecting the first direction in each sub-pixel, and storage capacitors including a first storage electrode, a second storage electrode overlapping at least a portion of the first storage electrode, a second storage connection electrode overlapping the first and second storage electrodes and connected to the second storage electrode at a first node, and a first storage connection electrode overlapping the second storage connection electrode and connected to the first storage electrode at a second node at which the first and second storage electrodes do not overlap each other, the first storage electrode, the second storage electrode, the second storage connection electrode and the first storage connection electrode being disposed in a storage capacitor region defined by intersecting the scan line, the first voltage line and the data line at each sub-pixel.

The backplane substrate may further include a first semiconductor layer configured such that the second storage connection electrode at the first node passes through the first semiconductor layer and is connected to the side surface of the first semiconductor layer, and a second semiconductor layer configured such that the first storage connection electrode at the second node passes through the second semiconductor layer and is connected to the side surface of the second semiconductor layer.

The backplane substrate may further include a switching thin film transistor including a switching gate electrode defined at a region of the scan line overlapping the upper surface of the first semiconductor layer, and connected to the data line and the first node at both ends of the first semiconductor layer, and a driving thin film transistor including a driving gate electrode defined as the second storage electrode vertically overlapping the second semiconductor layer, and connected to the second node and the first voltage line separated from the second storage electrode.

The backplane substrate may further include a sensing line disposed parallel to the scan line and a second voltage line disposed parallel to the data line at each sub-pixel, and the second semiconductor layer may extend from the second node and be connected to the second voltage line.

The backplane substrate may further include a sensing thin film transistor including a sensing gate electrode defined at a region of the sensing line vertically overlapping the second semiconductor layer, and connected to the second node and the second voltage line separated from the sensing line.

The first storage electrode may occupy about 50% to 100% of the storage capacitor region.

The upper and lower parts of the first storage electrode may be adjacent to the scan line and the sensing line on the same plane and the left and right parts of the first storage electrode may be adjacent to the data line and the first voltage line on the same plane.

The first storage electrode, the second storage electrode, the first and second semiconductor layers, the scan line and the sensing line, the data line and the first and second voltage lines, the second storage connection electrode and the first storage connection electrode may be sequentially disposed in order on the substrate.

The backplane substrate may further include a first insulating film provided between the first storage electrode and the second storage electrode, a first gate insulating film provided between the second storage electrode and the first and second semiconductor layers, a second gate insulating film provided between the first and second semiconductor layers and the scan line and sensing line, a second insulating film provided between the scan line and sensing line and the data line and first and second voltage lines, a third insulating film provided between the data line and first and second voltage lines and the second storage connection electrode, and a fourth insulating film provided between the second storage connection electrode and the first storage connection electrode.

In another aspect of the present disclosure, an organic light emitting diode display includes a substrate including a plurality of sub-pixels, a scan line disposed in a first direction at each sub-pixel, a first voltage line and a data line disposed in a second direction intersecting the first direction at each sub-pixel, storage capacitors including a first storage electrode, a second storage electrode overlapping at least a portion of the first storage electrode, a second storage connection electrode overlapping the first and second storage electrodes and connected to the second storage electrode at a first node, and a first storage connection electrode overlapping the second storage connection electrode and connected to the first storage electrode at a second node at which the first and second storage electrodes do not overlap each other, the first storage electrode, the second storage electrode, the second storage connection electrode and the first storage connection electrode being disposed in a storage capacitor region defined by intersecting the scan line, the first voltage line and the data line in each sub-pixel, a first semiconductor layer configured such that the second storage connection electrode at the first node passes through the first semiconductor layer and is connected to the side surface of the first semiconductor layer, and a second semiconductor layer configured such that the first storage connection electrode at the second node passes through the second semiconductor layer and is connected to the side surface of the second semiconductor layer, the first semiconductor layer and the second semiconductor layer being located between the second storage connection electrode and the second storage electrode, a switching thin film transistor including a switching gate electrode defined at a region of the scan line vertically overlapping the first semiconductor layer, and connected to the data line and the first node at both ends of the first semiconductor layer, a driving thin film transistor including a driving gate electrode defined as the second storage electrode vertically overlapping the second semiconductor layer, and connected to the second node and the first voltage line separated from the second storage electrode, and an organic light emitting diode including an anode connected to the second storage connection electrode, a cathode connected to a ground terminal, and an organic layer provided between the anode and the cathode and including a light emitting layer.

In a further aspect of the present disclosure, a sub-pixel of a backplate substrate for an organic light emitting display device includes a scan line and a sensing line spaced apart and parallel to each other, a first voltage line and a data line spaced apart and parallel to each other, intersecting the scan line and the sensing line, a storage capacitor region defined by the scan line, the sensing line, the first voltage line and the data line, first and second storage electrodes facing each other, disposed in the storage capacitor region, wherein the first storage electrode occupies at least 50% of the storage capacitor region and vertically overlapping at least a portion of one of the scan line, the sensing line, the first voltage line and the data line.

The organic light emitting diode display may further include a planarization layer formed on the first storage connection electrode and having a first contact hole exposing a part of the first storage connection electrode, and a bank formed on the anode and provided with a bank hole located at a position different from the first contact hole.

The anode may be connected to the first storage connection electrode through the first contact hole, and the organic layer may contact the anode within the bank hole.

The first contact holes of the respective sub-pixels may be located at the same position at the sub-pixels, and the bank holes of the respective sub-pixels may be located at the same position different from the first contact holes at the sub-pixels.

The anode may cover the storage capacitor region.

The organic light emitting diode display may further include a sensing line disposed parallel to the scan line and a second voltage line disposed parallel to the data line at each sub-pixel, and the second semiconductor layer may extend from the second node and be connected to the second voltage line.

The organic light emitting diode display may further include a sensing thin film transistor including a sensing gate electrode defined at a region of the sensing line vertically overlapping the second semiconductor layer, and connected to the second node and the second voltage line at the outside of the sensing line.

The first storage electrode may occupy about 50% to 100% of the storage capacitor region.

The upper and lower parts of the first storage electrode may be adjacent to the scan line and the sensing line on the same plane and the left and right parts of the first storage electrode may be adjacent to the data line and the first voltage line on the same plane.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure. In the drawings.

DETAILED DESCRIPTION OF THE DISCLOSURE

Reference will now be made in detail to the aspects of the present disclosure, examples of which are illustrated in the accompanying drawings. Wherever possible, the same reference numbers will be used throughout the drawings to refer to the same or like parts. In the following description of the present disclosure, a detailed description of known functions and configurations incorporated herein will be omitted when it may make the subject matter of the present disclosure rather unclear. Also, the names of elements used in the following description are defined in consideration of ease in preparation of the specification and may differ from the names of elements of an actual product.

Figure 1:
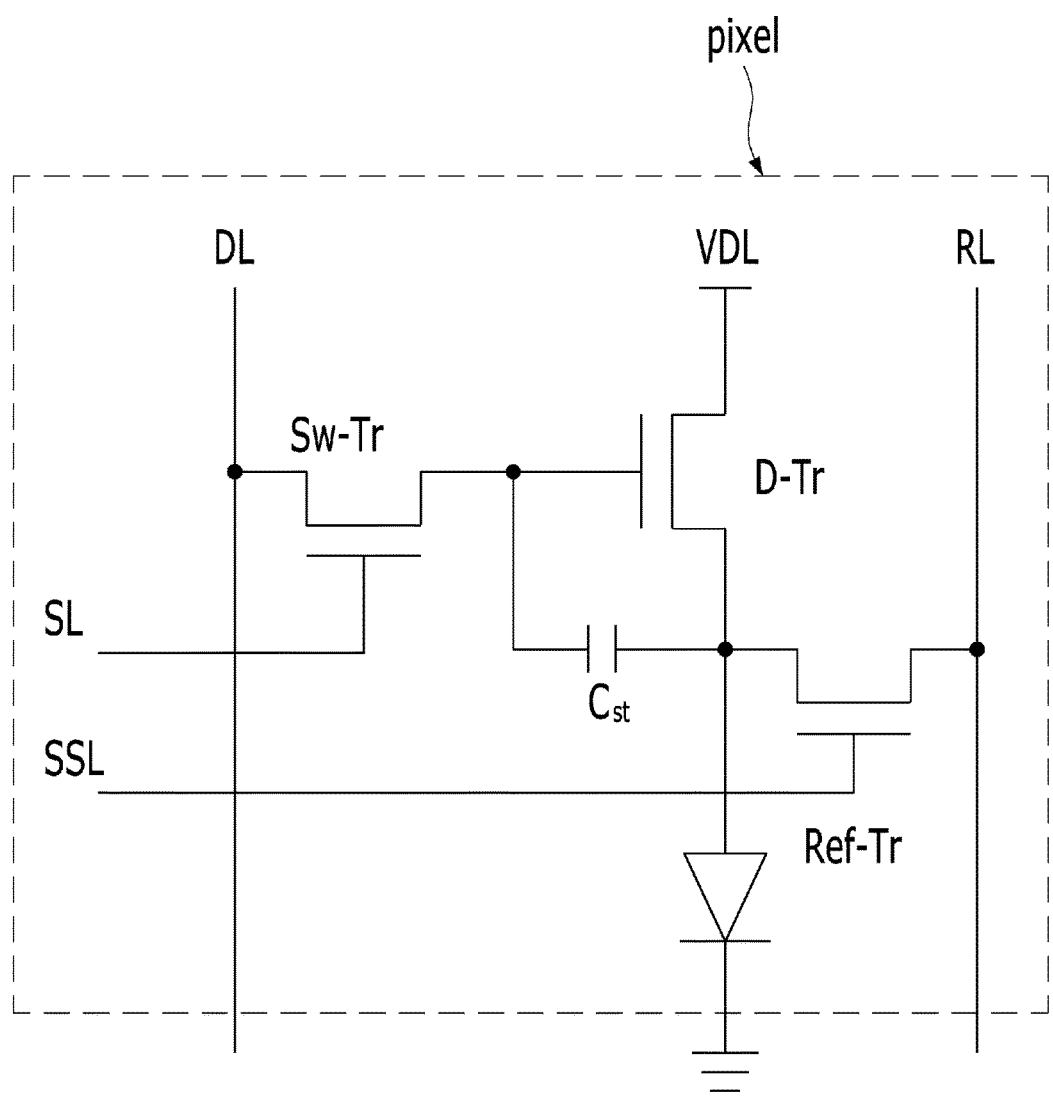
FIG. 1 is a circuit diagram of a sub-pixel of an organic light emitting diode display in accordance with the present disclosure.
Figure 2:
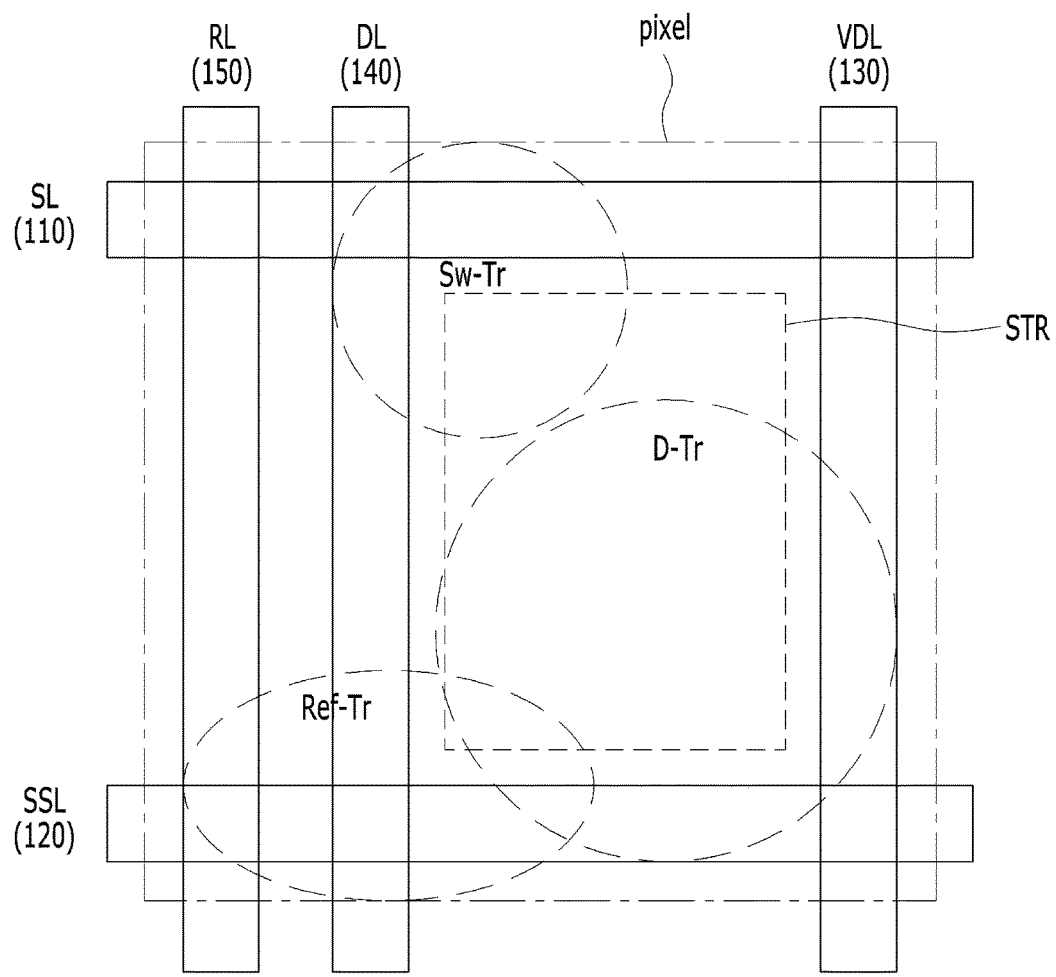
FIG. 2 is a plan view illustrating a storage capacitor region within a sub-pixel region of FIG. 1.

FIG. 1 is a circuit diagram of a sub-pixel of an organic light emitting diode display in accordance with the present disclosure, and FIG. 2 is a plan view illustrating a storage capacitor region within a sub-pixel region of FIG. 1.

Each sub-pixel of the organic light emitting diode display in accordance with the present disclosure, as exemplarily shown in FIGS. 1 and 2, includes a scan line SL 110 and a sensing line SSL 120 which are disposed parallel to each other in the horizontal direction, a first voltage line VDL 130, a data line DL 140 and a second voltage line RL 150 which intersect the scan line SL 110 and the sensing line SSL 120 and are disposed parallel to each other, a switching thin film transistor Sw-Tr provided at the intersection between the scan line SL 110 and the data line DL 140, a driving thin film transistor D-Tr provided between the switching thin film transistor Sw-Tr and the first voltage line VDL 130, and a sensing thin film transistor Ref-Tr provided at the intersection between the sensing line SSL 120 and the second voltage line RL 150.

Here, a connection node of the switching thin film transistor Sw-Tr and the driving thin film transistor D-Tr is referred to as a first node A, and a connection node of the driving thin film transistor D-Tr and the sensing thin film transistor Ref-Tr is referred to as a second node B.

Storage capacitors Cst are provided between the first node A and the second node B to exhibit holding characteristics of the sub-pixel, and one electrode of the storage capacitor Cst, i.e., the second node B, is connected to an organic light emitting diode OLED. An anode of the organic light emitting diode OLED is connected to the second node B, a cathode of the organic light emitting diode OLED is connected to a ground terminal, and an organic light emitting layer is provided between the anode and the cathode.

A switching gate electrode SG of the switching thin film transistor Sw-Tr may be a part of the scan line SL 110 or be a pattern protruding from the scan line SL 110, a switching drain electrode SD of the switching thin film transistor Sw-Tr is connected to the data line DL 140, a switching source electrode SS of the switching thin film transistor Sw-Tr is connected to the first node A, and the first node A is connected to a driving gate electrode DG of the driving thin film transistor D-Tr.

An electrode of the driving thin film transistor D-Tr connected to the first node A serves as the driving gate electrode DG, a driving drain electrode DD of the driving thin film transistor D-Tr is connected to the first voltage line VDL, and a driving source electrode DS of the driving thin film transistor D-Tr is connected to the second node B.

Further, a sensing gate electrode RG of the sensing thin film transistor Ref-Tr may be a part of the sensing line SSL 120 or be a pattern protruding from the sensing line SSL 120, a sensing drain electrode RD of the sensing thin film transistor Ref-Tr is connected to the second voltage line RL, and a sensing source electrode RS of the sensing thin film transistor Ref-Tr is connected to the second node B.

Here, the sensing line SSL 120, the second voltage line RL 150 and the sensing thin film transistor Ref-Tr may be omitted from the sub-pixel, as circumstances require.

The switching thin film transistor Sw-Tr is connected to the scan line SL 110 and the data line DL 140 and serves to select the corresponding sub-pixel. Further, the driving thin film transistor D-Tr serves to drive the organic light emitting diode OLED of the sub-pixel selected by the switching thin film transistor Sw-Tr. If the sensing thin film transistor Ref-Tr is provided, the sensing thin film transistor Ref-Tr is provided between the sensing line SSL 120 and the second voltage line RL 150 and serves to sense or initialize a voltage value of the second node B. Hereinafter, a case in that the sensing thin film transistor Ref-Tr is provided in order to sense or initialize the voltage value of the second node B will be exemplarily described.

In the illustrated circuit diagram of the sub-pixel, driving voltage may be supplied to the first voltage line VDL 130, and reference voltage may be supplied to the second voltage line RL 150 or a voltage value of the second node B may be read through the second voltage line RL 150.

A plurality of sub-pixels is provided in a matrix on a substrate (hereinafter, with reference to numeral 100 of FIG. 4), a storage capacitor region STR is defined as being within a region formed by intersecting the spaced scan line SL 110 and sensing line SSL 120 and the spaced first voltage line VDL 130 and data line DL 140, in each sub-pixel.

The storage capacitor region STR is a region occupied by opposite first and second storage electrodes. In a backplane substrate in accordance with the present disclosure which may implement very high resolution of 1500 ppi (pixel per inch) or more, the width of individual sub-pixels is very small, i.e., within several μm, and, thus, an area occupied by a circuit within the sub-pixel is decreased. In such a very high resolution structure, in order to maximize a space among lines within the sub-pixel as the storage capacitor region STR occupied by storage capacitors Cst and to increase capacitance, storage capacitors Cst are provided in parallel in a circuit and, thus, holding characteristics may be sufficiently maintained so as to maintain gradation expression of each sub-pixel for a designated time.

In this case, the first storage electrode forming the storage capacitors Cst may occupy about 50% to 100% of the storage capacitor region STR. Therefore, the first storage electrode may have a sufficient size to contact at least one of the scan line SL 110, the sensing line SSL 120, the data line DL 140 and the first voltage line VDL 130. This means that the storage capacitor region STR overlaps the region of other thin film transistors within the sub-pixel and thereby utilization of a space within the sub-pixel is maximized.

Figure 3:
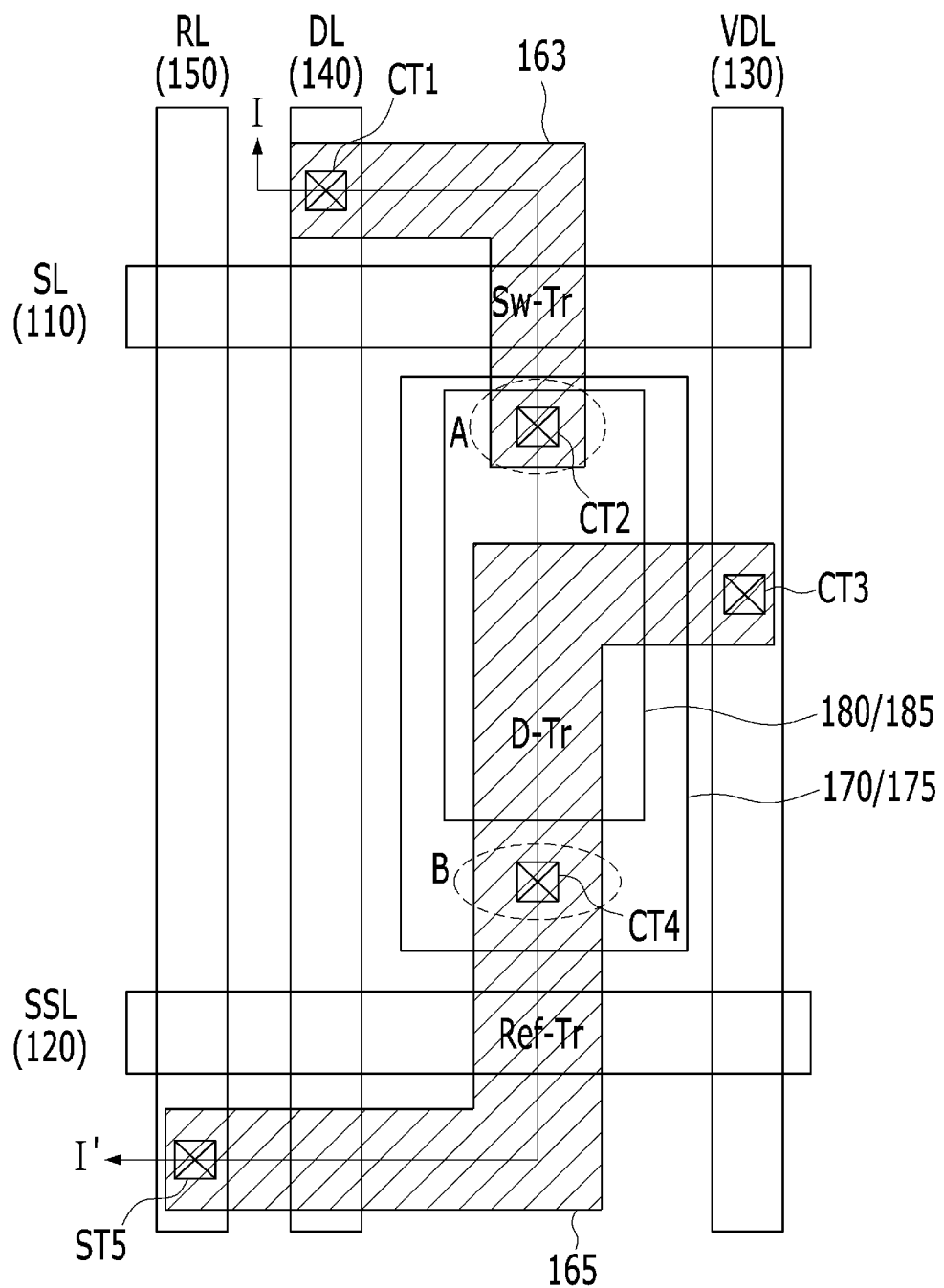
FIG. 3 is a plan view of a backplane substrate in accordance with the present disclosure.
Figure 4:
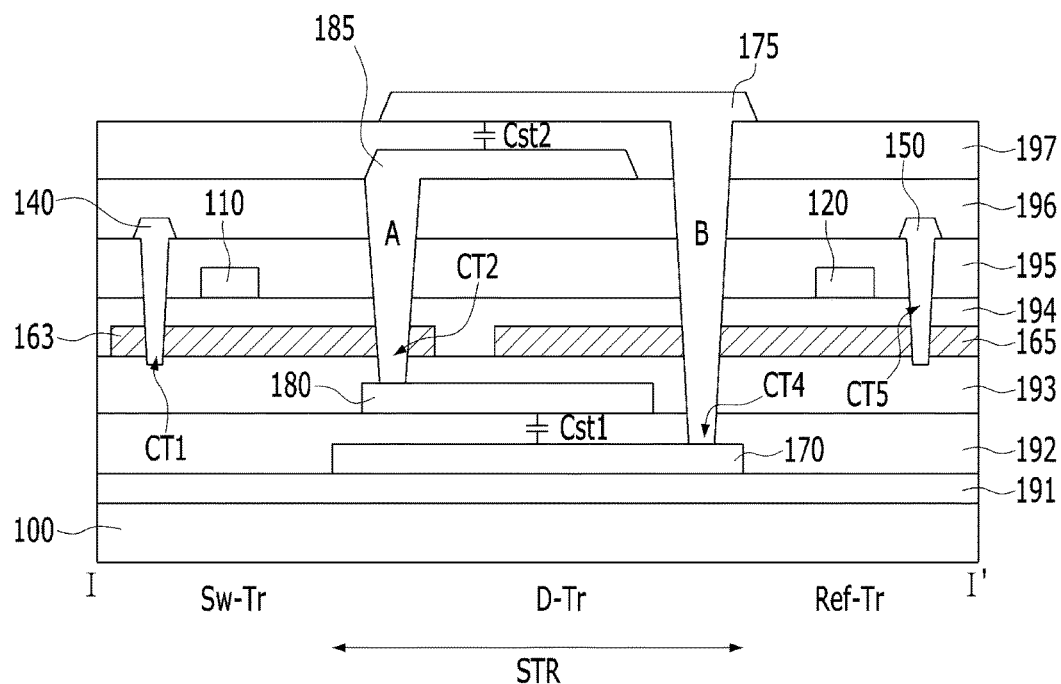
FIG. 4 is a cross-sectional view of FIG. 3, taken along line I-I'.
Figure 5:
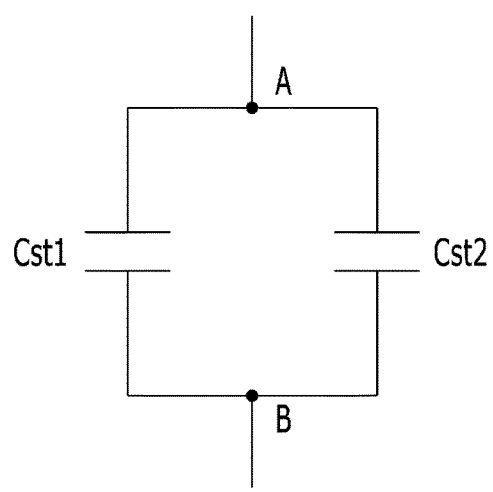
FIG. 5 is a circuit diagram illustrating storage capacitors of FIG. 4.

FIG. 3 is a plan view of a backplane substrate in accordance with the present disclosure, FIG. 4 is a cross-sectional view of FIG. 3, taken along line I-I', and FIG. 5 is a circuit diagram illustrating storage capacitors of FIG. 4.

As exemplarily shown in FIGS. 3 to 5, the backplane substrate in accordance with the present disclosure includes a substrate having a plurality of sub-pixels, a scan line 110 and a sensing line 120 disposed in a first direction in each sub-pixel, a first voltage line 130 and a data line 140 disposed in a direction intersecting the first direction in each sub-pixel, and storage capacitors Cst including a first storage electrode 170, a second storage electrode 180 partially overlapping the first storage electrode 170, a second storage connection electrode 185 overlapping the first and second storage electrodes 170 and 180 and connected to the second storage electrode 180 at a first node A, and a first storage connection electrode 175 overlapping the second storage connection electrode 185 and connected to the first storage electrode 170 at a second node B, at which the first and second storage electrodes 170 and 180 do not overlap each other, in a storage capacitor region STR defined by intersecting the scan line 110, the sensing line 120, the first voltage line 130 and the data line 140 in each sub-pixel.

Further, a first semiconductor layer 163 is configured such that the second storage connection electrode 185 at the first node A passes through the first semiconductor layer 163 and is connected to the side surface of the first semiconductor layer 163, and a second semiconductor layer 165 is configured such that the first storage connection electrode 175 at the second node B passes through the second semiconductor layer 165 and is connected to the side surface of the second semiconductor layer 165. Particularly, since the second storage connection electrode 185 and the first storage connection electrode 175 pass through the first and second semiconductor layers 163 and 165 at the first and second nodes A and B so as to achieve electrical contact with the first and second semiconductor layers 163 and 165, it is not necessary to separately form a source electrode of a switching thin film transistor Sw-Tr or source electrodes of a driving thin film transistor D-Tr and a sensing thin film transistor Ref-Tr in addition to electrodes forming the storage capacitors Cst and, thus, it is not necessary to separately define contact regions with these electrodes. Therefore, the storage capacitors Cst and thin film transistors provided in the sub-pixel may overlap each other, the storage capacitor region STR in a circuit may be completely used and, thus, a plurality of thin film transistors may be easily provided in the sub-pixel having a small area.

Further, the switching thin film transistor Sw-Tr uses a region of the scan line 110 overlapping the upper surface of the first semiconductor layer 163 as a switching gate electrode, and is connected to both ends of the first semiconductor layer 163 at first and second contact portions CT1 and CT2 with the data line 140 and the second storage connection electrode 185. The second contact portion CT2 corresponds to the first node A, and electrodes connected to the first node A, i.e., the region of the first semiconductor layer 163, the second storage electrode 180 and the second storage connection electrode 185, have the same potential. Here, the first semiconductor layer 163 is provided with the data line 140 and the second storage connection electrode 185 at both ends thereof, spaced apart from the scan line 110 provided on the center of the first semiconductor layer 163. In this case, the data line 140 and the second storage connection electrode 185 are respectively used as a switching drain electrode and a switching source electrode. Further, the second storage connection electrode 185 passes through the first semiconductor layer 163 at the first node A and is connected to the second storage electrode 180 provided below the first semiconductor layer 163.

The first semiconductor layer 163 has, for example, an L-shape and includes a central region overlapping the scan line 110 as a channel region, the channel region is an intrinsic region which is not doped with impurity, both sides of the channel region are defined as doping regions, and contact regions with the data line 140 and the second storage connection electrode 185 are located in the respective doping regions. Therefore, the first node A is located in the doping region of the first semiconductor layer 163.

The driving thin film transistor D-Tr uses the second storage electrode 180 overlapping the second semiconductor layer 165 as a driving gate electrode, and is connected to the second semiconductor layer 165 at third and fourth contact portions CT3 and CT4 with the first voltage line 130 and the first storage connection electrode 175 outside the second storage electrode 180. The fourth contact portion CT4 corresponds to the second node B, and electrodes connected to the second node B, i.e., the first storage electrode 170, a region of the second semiconductor layer 165 connected to the fourth contact portion CT4, and the first storage connection electrode 175, have the same potential. Here, the second storage electrode 180 provided under the second semiconductor layer 165, which functions as a driving gate electrode, is conductively connected to the first node A and thus has the same potential as the source electrode of the switching thin film transistor Sw-Tr, and the driving thin film transistor D-Tr may be turned on only if the switching thin film transistor Sw-Tr is selected. Further, both ends of the second semiconductor layer 165 provided with the second storage electrode 180 on the center of the second semiconductor layer 165 are connected to the first voltage line 130 and the first storage connection electrode 175, spaced apart from the scan line 110, and connection regions thereof are respectively used as the driving drain electrode and the driving source electrode. Also, the first storage connection electrode 175 passes through the second semiconductor layer 165 at the second node B and is connected to the first storage electrode 170 provided below the second semiconductor layer 165.

With reference to FIG. 4, in terms of vertical section, the first and second storage electrodes 170 and 180, the second storage connection electrode 185 and the first storage connection electrode 175 are sequentially disposed in order on the substrate 100, and these electrodes 170, 180, 175 and 185 are located within the storage capacitor region STR. Since the first storage connection electrode 175 at the second node B should maintain a non-contact state with the second storage electrode 180 and the second storage connection electrode 185, located between the first storage electrode 170 and the first storage connection electrode 175, the second storage electrode 180 and the second storage connection electrode 185 should be located at a position avoiding the second node B, i.e., the fourth contact portion CT4. Therefore, the second storage electrode 180 and the second storage connection electrode 185 have areas smaller than the areas of the first storage electrode 170 and the first storage connection electrode 175.

The first storage electrode 170 may occupy 50% to 100% of the area of the storage capacitor region STR and, as circumstances require, the first storage electrode 170 may be provided in a layer differing from other wirings and may thus contact at least one of the scan line 110, the sensing line 120, the data line 140 and the first voltage line 130. Although this aspect describes that each of the first storage electrode 170 and the second storage electrode 180 has one connection electrode and one connection region, each of the first storage electrode 170 and the second storage electrode 180 may have a plurality of connection electrodes and a plurality of connection regions.

In the backplane substrate in accordance with the present disclosure, as exemplarily shown in FIG. 5, each sub-pixel includes a first storage capacitor Cst1 provided at a region overlapping the first storage electrode 170 and a second storage capacitor Cst overlapping the second storage connection electrode 185 and disposed parallel to the first storage capacitor Cst1 and, even if the size of the second storage electrode 180 is small and the capacitance of the first storage capacitor Cst1 is decreased, total storage capacitance of the storage capacitances of each sub-pixel may be increased to two times the storage capacitance of a single storage capacitor structure. Further, even though storage capacitance is increased, the second storage capacitor Cst2 having subsidiary capacitance, which does not invade other regions of the sub-pixel, is further provided within the area of the first storage capacitor Cst1 and, thus, sufficient storage capacitance may be secured in a very high resolution structure having a limited sub-pixel area.

Moreover, the sub-pixel may further include a second voltage line 150 disposed parallel to the data line 140 and the second semiconductor layer 165 may extend from the second node B and be connected to the second voltage line 150.

The sensing thin film transistor Ref-Tr uses a region of the sensing line 120 overlapping the second semiconductor layer 165 as a sensing gate electrode, and a sensing drain electrode and a sensing source electrode of the sensing thin film transistor Ref-Tr are connected to the second node B and the second voltage line 150 at the outside of the sensing line 220. If each sub-pixel has a 2T1C circuit structure, the sensing thin film transistor Ref-Tr may be omitted and, in this case, the sensing line 120 and the second voltage line 150 may be omitted and the storage capacitor region STR may be defined as a region between the scan line 110 and the first voltage line 130 and data line 140 intersecting the scan line 110.

In a plane, as exemplarily shown in FIG. 3, the upper and lower parts of the first storage electrode 170 may be adjacent to the scan line 110 and the sensing line 120 and the left and right parts of the first storage electrode 170 may be adjacent to the data line 140 and the first voltage line 130. The reason for this is that the first storage electrode 170 is located in a layer differing from other lines and may thus have space freedom in a plane. However, the upper and lower parts of the first storage electrode 170 should not overlap the scan line 110 and the sensing line 120 and the left and right parts of the first storage electrode 170 should not overlap the data line 140 and the first voltage line 130, and the reason for this is to prevent generation of undesired parasitic capacitances at the overlapping regions.

The second semiconductor layer 165 is formed to have, for example, a laterally reversed Z-shape throughout the regions of the driving thin film transistor D-Tr and the sensing thin film transistor Ref-Tr connected to each other at the second node B. A portion of the second semiconductor layer 165 overlapping the second storage electrode 180 and a portion of the second semiconductor layer 165 overlapping the sensing line 120, are defined as intrinsic regions and become channel regions of the driving thin film transistor D-Tr and the sensing thin film transistor Ref-Tr, and other regions of the second semiconductor layer 165 except for the channel regions are doped and thus third to fifth contact portions CT3, CT4 and CT5 may be located in these regions. Here, the third to fifth contact portions CT3, CT4 and CT5 may be defined by selectively removing a second insulating film 195 and a second gate insulating film 194. Although, as exemplarily shown in these figures, source/drain metals filling the third and fifth contact portions CT3 and CT5 may contact the side surface of the second semiconductor layer 165 by removing the second semiconductor layer 165 having a thickness corresponding to the third and fifth contact portions CT3 and CT5, the disclosure is not limited thereto and the source/drain metals of the third and fifth contact portions CT3 and CT5 may contact the upper surface of the second semiconductor layer 165.

Although FIG. 3 exemplarily illustrates that the second voltage line 150 is adjacent to the left side of the data line 140, the second voltage line 150 may be disposed adjacent to the right side of the first voltage line 130. In this case, the second semiconductor layer 165 has a C-shape, and an end portion of a pattern bent from the second semiconductor layer 165 extending in the downward direction of the sensing line 120 so as to sequentially overlap the first and second voltage lines 130 and 150 located at the right side is defined as the fifth contact portion CT5.

As exemplarily shown in FIG. 4, the backplane substrate further includes a first insulating film 192 provided between the first storage electrode 170 and the second storage electrode 180, a first gate insulating film 193 provided between the second storage electrode 180 and the first and second semiconductor layers 163 and 165, a second gate insulating film 194 provided between the first and second semiconductor layers 163 and 165 and the scan line 110 and sensing line 120, a second insulating film 195 provided between the scan line 110 and sensing line 120 and the data line 140 and first and second voltage lines 130 and 150 (the first voltage line 130 is not illustrated in FIG. 4 but is located in the same layer as the data line 140 and the second voltage line 150), a third insulating film 196 provided between the data line 140 and first and second voltage lines 130 and 150 and the second storage connection electrode 185, and a fourth insulating film 197 provided between the second storage connection electrode 185 and the first storage connection electrode 175.

As circumstances require, a buffer layer 191 may be further provided between the substrate 100 and the first storage electrode 170. The buffer layer 191 is selectively provided.

In the backplane substrate in accordance with the present disclosure, the driving thin film transistor D-Tr includes the driving gate electrode (the second storage electrode 180) provided below the second semiconductor layer 165 and thus has a bottom gate structure, the switching thin film transistor Sw-Tr and the sensing thin film transistor Ref-Tr respectively include the scan line 110 and the sensing line 120 provided above the first and second semiconductor layers 163 and 165 as the switching and sensing gate electrodes and thus have a top gate structure and, thereby, one sub-pixel includes different gate structures. Particularly, in the driving thin film transistor D-Tr, since the second storage electrode 180 serving as the driving gate electrode is conductively connected to the second storage connection electrode 185 at the first node A, the second storage connection electrode 185 having the same potential as the driving gate electrode is located above the second semiconductor layer 165 and, thus, a structure provided with driving gate electrodes formed above and below the second semiconductor layer 165 is prepared and characteristics of the driving thin film transistor D-Tr may be further stabilized.

Further, in the backplane substrate in accordance with the present disclosure, the first and second storage electrodes 170 and 180 located below the first and second semiconductor layers 163 and 165 have small thicknesses. Both the first and second storage electrodes 170 and 180 have thicknesses of less than 1000 Å, and, particularly, may have thicknesses of 500 Å. The reason for this is that the first and second semiconductor layers 163 and 165 provided above the first and second storage electrodes 170 and 180 are formed by primarily depositing amorphous silicon and then converting amorphous silicon into polysilicon through laser crystallization and, in this case, in order to secure uniformity in crystal characteristics, surface step heights of layers provided below the first and second semiconductor layers 163 and 165 should be decreased. Therefore, the first and second storage electrodes 170 and 180 have small thicknesses.

Additionally, the second contact portion CT2 is provided at the first node A, and has a contact hole passing through the third insulating film 196, the second insulating film 195, the second gate insulating film 194, the first semiconductor layer 163 and the first gate insulating film 193. The second storage connection electrode 185 filling the contact hole in the second contact portion CT2 is connected to the second storage electrode 180.

Here, the second storage electrode 180 may be formed of a transparent metal oxide. The reason why the second storage electrode 180 is formed of a transparent metal oxide is that a plurality of insulating films and semiconductor layers is etched at once to a great depth when the second contact portion CT2 is defined and, during such a process, if a metal material, such as molybdenum, vulnerable to an etching solution or etching gas to remove the insulating films and the semiconductor layers, is used as the second storage electrode 180, the second storage electrode 180 located under the second contact portion CT2 may be removed and, when severely removed, the first storage electrode 170 provided below the second storage electrode 180 may be removed. As such, if the second storage electrode 180 located under the second contact portion CT2 and the first storage electrode 170 provided below the second storage electrode 180 are removed or partially etched, the second storage connection electrode 185 filling the second contact portion CT2 after definition of the second contact portion CT2 may contact not only the second storage electrode 180 but also the side part of the first storage electrode 170 and short circuit between the first and second storage electrodes 170 and 180 may occur.

Therefore, in order to prevent such short circuit, the second storage electrode 180 is formed of a transparent metal oxide having resistance to an etching solution or etching gas to define the second contact portion CT2 and, thereby, when the second contact portion CT2 is defined, the second storage electrode 180 is stably kept without damage.

For example, the transparent metal oxide may be one of indium tin oxide (ITO), indium zinc oxide (IZO), indium tin zinc oxide (ITZO) and indium gallium zinc oxide (IGZO).

The fourth contact portion CT4 having a contact hole passing through the fourth insulating film 197, the third insulating film 196, the second insulating film 195, the second gate insulating film 194, the second semiconductor layer 165, the first gate insulating film 193 and the first insulating film 192 is provided at the second node B, and the first storage connection electrode 175 filling the contact hole in the fourth contact portion CT4 is connected to the first storage electrode 170.

The first storage electrode 170 may be formed of a light-shielding metal. For example, the light-shielding metal used as the first storage electrode 70 may be one of gold, silver, copper, aluminum, chrome, molybdenum and titanium, or a metal laminate or an alloy including at least one thereof.

Further, the first and second storage connection electrodes 175 and 185 may be formed of a light-shielding metal having excellent conductivity, in the same manner as the first storage electrode 170.

The first storage electrode 170 formed of a light-shielding metal is vulnerable to an etching solution or etching gas used to form the fourth contact portion CT4 and, thus, a part of the first storage electrode 170 may be removed or a thickness of a region of the first storage electrode 170 corresponding to the fourth contact portion CT4 may be removed. Even if the thickness of a region of the first storage electrode 170 corresponding to the fourth contact portion CT4 is removed, the first storage connection electrode 175 in the fourth contact portion CT4 may contact the side part of the first storage electrode 170 and, thus, the storage capacitor may be normally operated.

Figure 6A:
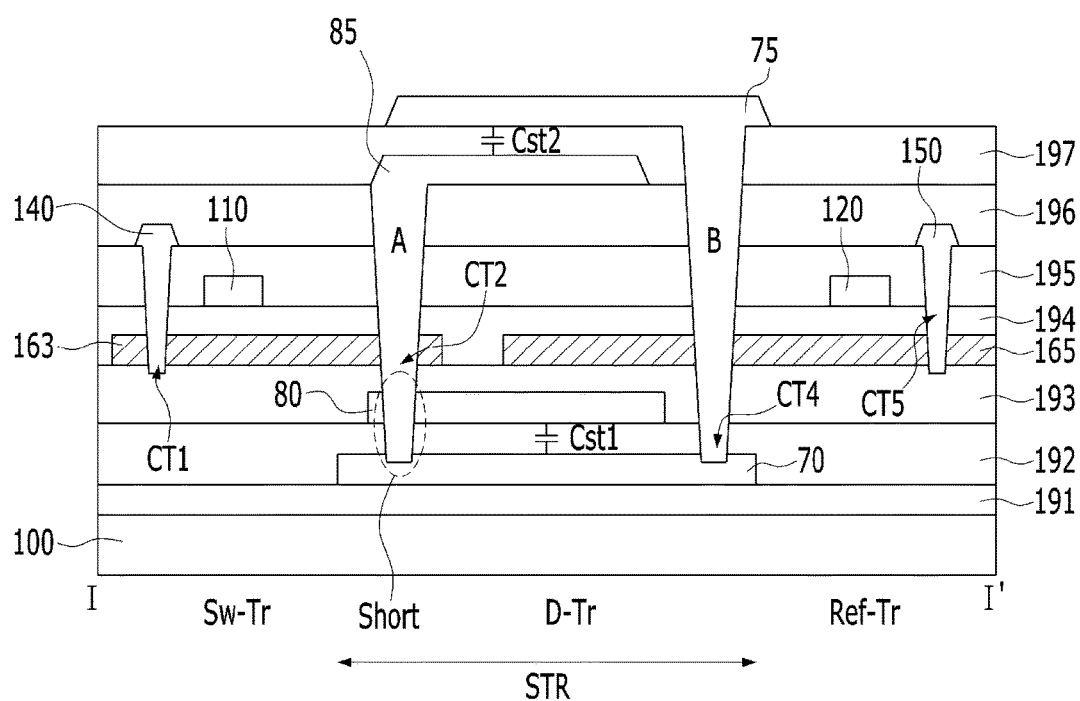
FIG. 6A is a cross-sectional view illustrating a backplane substrate in accordance with comparative example 1.
Figure 6B:
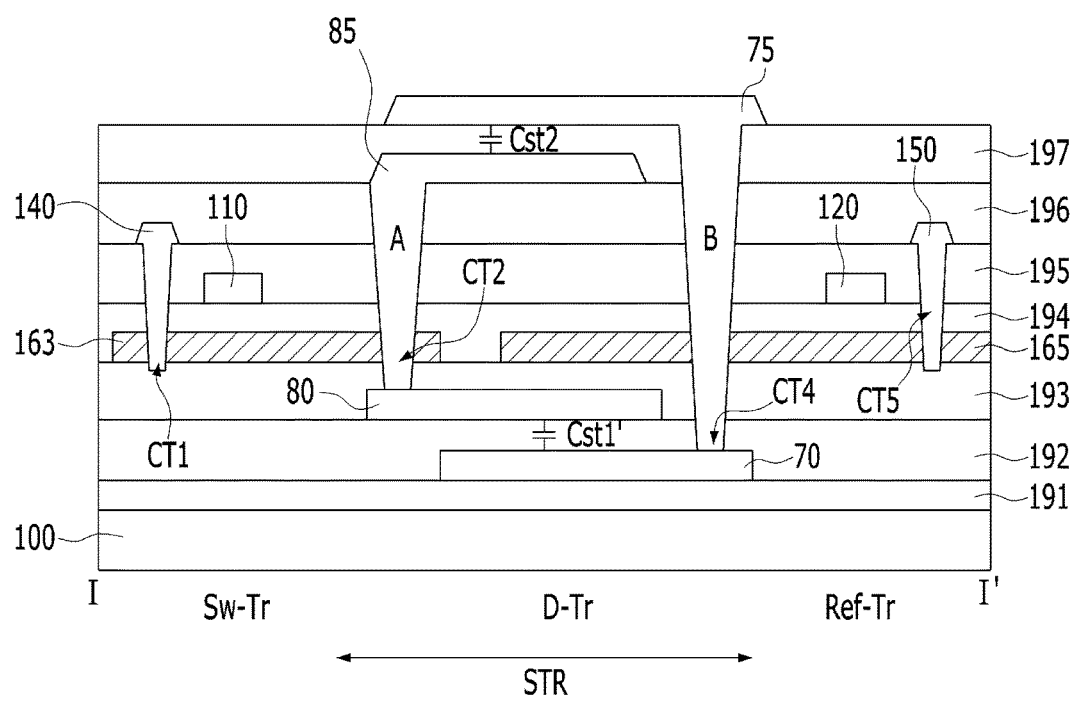
FIG. 6B is a cross-sectional view illustrating a backplane substrate in accordance with comparative example 2.

FIG. 6A is a cross-sectional view illustrating a backplane substrate in accordance with comparative example 1, and FIG. 6B is a cross-sectional view illustrating a backplane substrate in accordance with comparative example 2.

In comparative examples 1 and 2, first and second storage electrodes 70 and 80 are formed of a light-shielding material, such as molybdenum, in common.

As exemplarily shown in FIG. 6A, during an etching process to form a second contact portion CT2, the second storage electrode 80 is etched by an etching solution or etching gas and thus a contact hole of the second contact portion CT2 is formed up to the first storage electrode 70. Then, a second storage connection electrode 85 within the second contact portion CT2 is connected to the first and second storage electrodes 70 and 80, thus causing short circuit.

In order to avoid etching of the second storage electrode 80 by the etching solution or etching gas, in comparative example 2, the width of a first storage electrode 70 is decreased so that the first storage electrode 70 does not overlap the second contact portion CT2, as exemplarily shown in FIG. 6B.

However, in case of comparative example 2, the width (area) of the first storage electrode 70 forming a first storage capacitor Cst1' is decreased and, thus, total storage capacitance is reduced.

The backplane substrate in accordance with the present disclosure, in which the second storage electrode 180 is formed of a transparent conductive oxide, may simultaneously solve problems caused by comparative examples, i.e., electrical short and reduction in capacitance of storage capacitors.

Further, in the backplane substrate in accordance with the present disclosure, if the second storage electrode 180 provided below the first and second semiconductor layers 163 and 165 is formed of a transparent conductive oxide, surface roughness of the second storage electrode 180 is decreased, as compared to a second storage electrode formed of a general metal, and, thus, crystallization characteristics of the first and second semiconductor layers 163 and 165 may be stabilized.

The he above-described backplane substrate may be applied to any structure including the above-described parallel structure of storage capacitors and wirings at the boundary between sub-pixels and be used in various types of displays requiring sufficient capacitance in sub-pixels having a limited area.

Hereinafter, an example in which the above-described backplane substrate structure is used in an organic light emitting diode display will be described.

Figure 7:
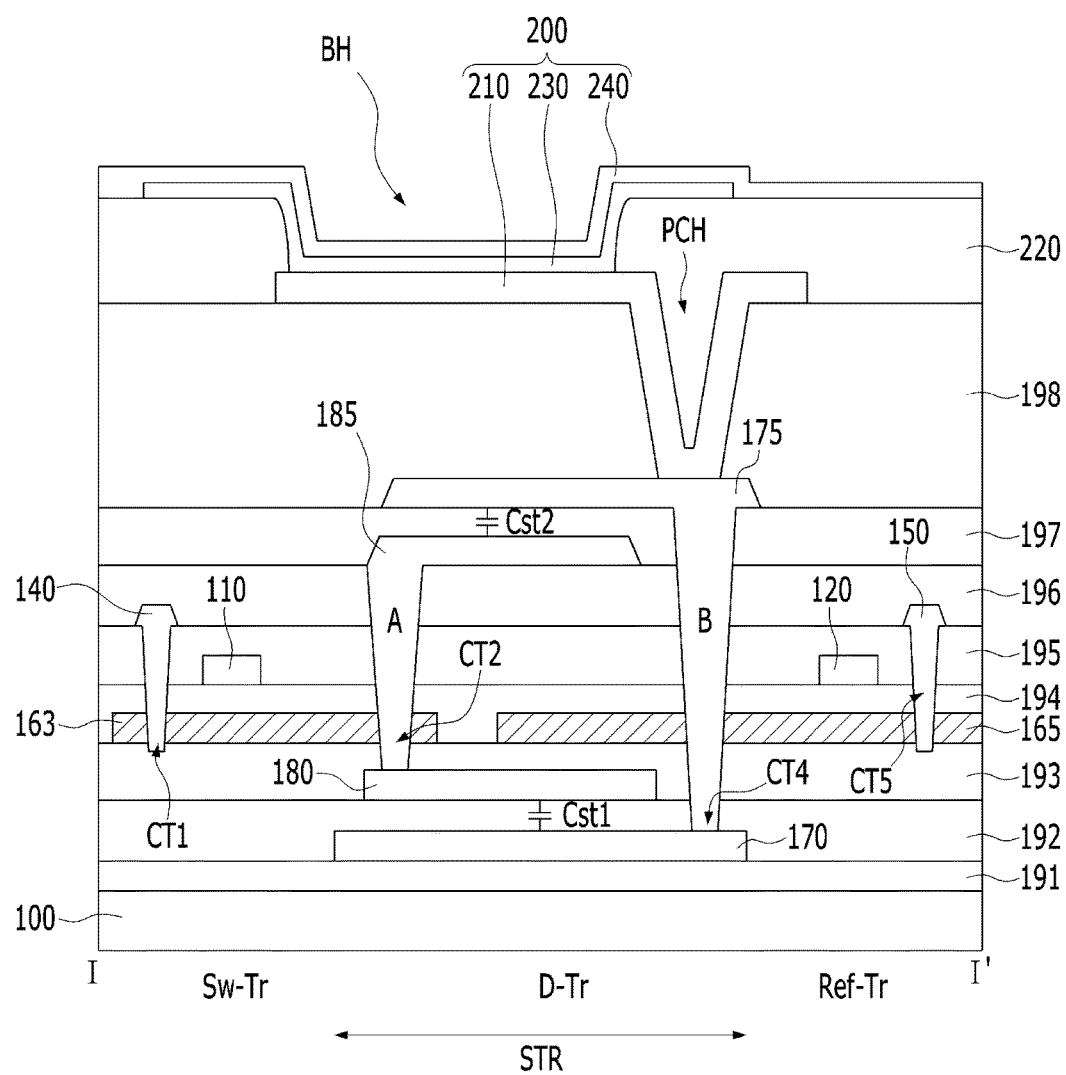
FIG. 7 is a cross-sectional view of an organic light emitting diode display in accordance with one aspect of the present disclosure.

FIG. 7 is a cross-sectional view of an organic light emitting diode display in accordance with one aspect of the present disclosure.

The structure of a backplane substrate has been described above and a detailed description thereof will thus be omitted.

As exemplarily shown in FIG. 7, an organic light emitting diode OLED includes an anode 210 connected to a first storage connection electrode 175, an organic layer 230 provided on the anode 210 and including a light emitting layer, and a cathode 240 provided on the organic layer 230.

The organic layer 230 may include a hole transport layer, an organic light emitting layer and an electron transport layer, a hole injection layer may be provided between the hole transport layer and the anode 210, and an electron injection layer may be provided between the electron transport layer and the cathode 240.

In such a structure including the backplane substrate, a planarization layer 198 to remove surface roughness is provided under the anode 210, and a planarization layer hole PCH to expose a part of the first storage connection electrode 175 is formed through the planarization layer 198.

A bank 220 having a bank hole BH to define a light emitting region of the organic layer 230 is further provided between the anode 210 and the organic layer 230. The bank 220 is located at an area except for the bank hole BH and, during a process of depositing the organic layer 230 including the organic light emitting layer, organic matter in a vapor phase is deposited to cover at least the planarization bank hole BH of each sub-pixel, thereby forming the organic layer 230.

In the organic light emitting diode display in accordance with the present disclosure, the bank hole BH is located at a position avoiding the planarization layer hole PCH and thus reduces a step height difference in a deposition region when the organic layer 230 is formed, and is thus provided in a completely flat region so as to prevent cutting of the organic layer 230 due to a step. Therefore, the bank hole BH may be completely used as a light emitting region and, thus, luminous efficacy may be improved. Further, in the organic light emitting diode display in accordance with the present disclosure, the planarization layer hole PCH of the planarization layer 198 is provided at the same position in each sub-pixel and thus a degree of position freedom of the bank hole BH provided above the planarization layer hole PCH may be raised, and the bank hole BH is easily disposed without a step height difference and thus a uniform light emitting region may be secured.

The organic layer 230 may be individually formed according to respective sub-pixels or be formed on the entire surface of an active area including the sub-pixels. Due to characteristics of the bank 220 having a great thickness, deposition characteristics at the side part of the bank hole BH are lowered and, particularly, if the bank hole BH is provided so as to overlap the planarization layer hole PCH, a step height difference at an anode formation region may be increased and thus deposition characteristics of the organic layer 230 formed on the anode 210 may be lowered. However, in the present disclosure, the planarization layer hole PCH deviating from the region of the bank hole BH serving as a light emitting region is provided on the planarization layer 198, thereby preventing deterioration in deposition characteristics and loss of light emission at such a region.

The anode 210 is formed so as to sufficiently cover the first storage connection electrode 175 including the planarization layer hole PCH in each sub-pixel. Actually, the anode 210 is formed to have a greater size than a storage capacitor region STR, the region of the bank hole BH, which will be subsequently formed, is increased within the range of a region except for the planarization layer hole PCH and, thus, the maximum light emitting region may be provided. That is, based on a single sub-pixel, the anode 210 is formed within the boundary of the sub-pixel so as to be maximally close to the boundary, in the structure shown in FIG. 2. However, since the anode 210 is spaced apart from an anode 210 of an adjacent sub-pixel, there is a distance between the anodes 210 of the adjacent sub-pixels within an allowable range in a process.

Hereinafter, a structure in which adjacent sub-pixels having a mirror-type structure are provided will be described. For example, second voltage lines and/or a sensing line are shared by adjacent sub-pixels.

Figure 8A:
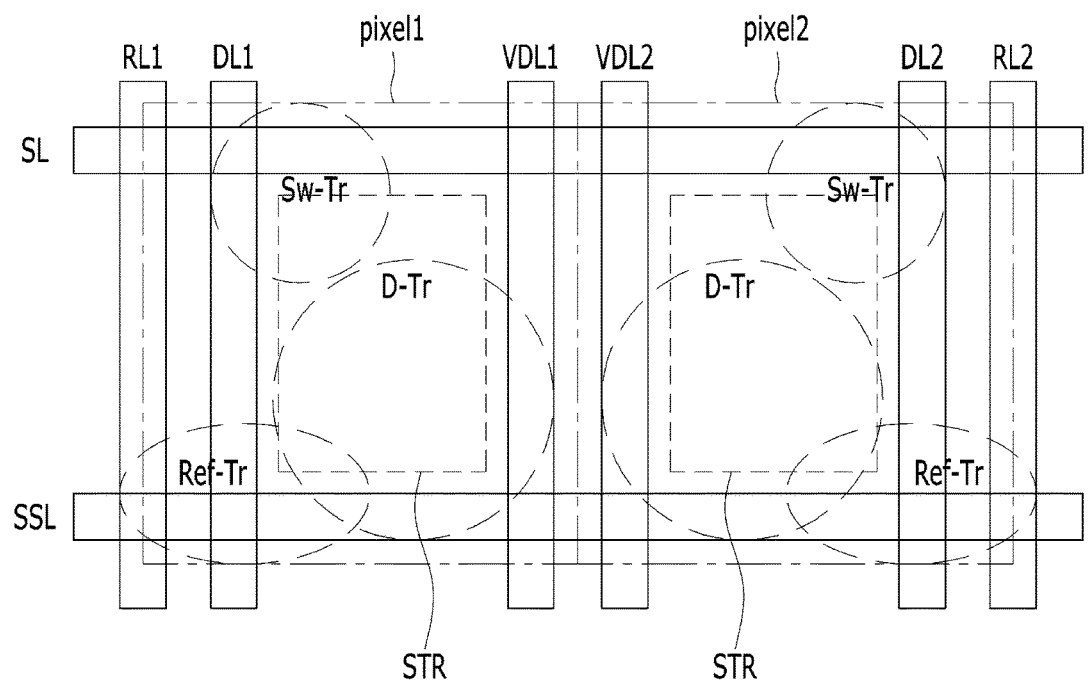
FIGS. 8A and 8B are schematic views illustrating various sub-pixel arrangements of the organic light emitting diode display in accordance with aspects of the present disclosure.
Figure 8B:
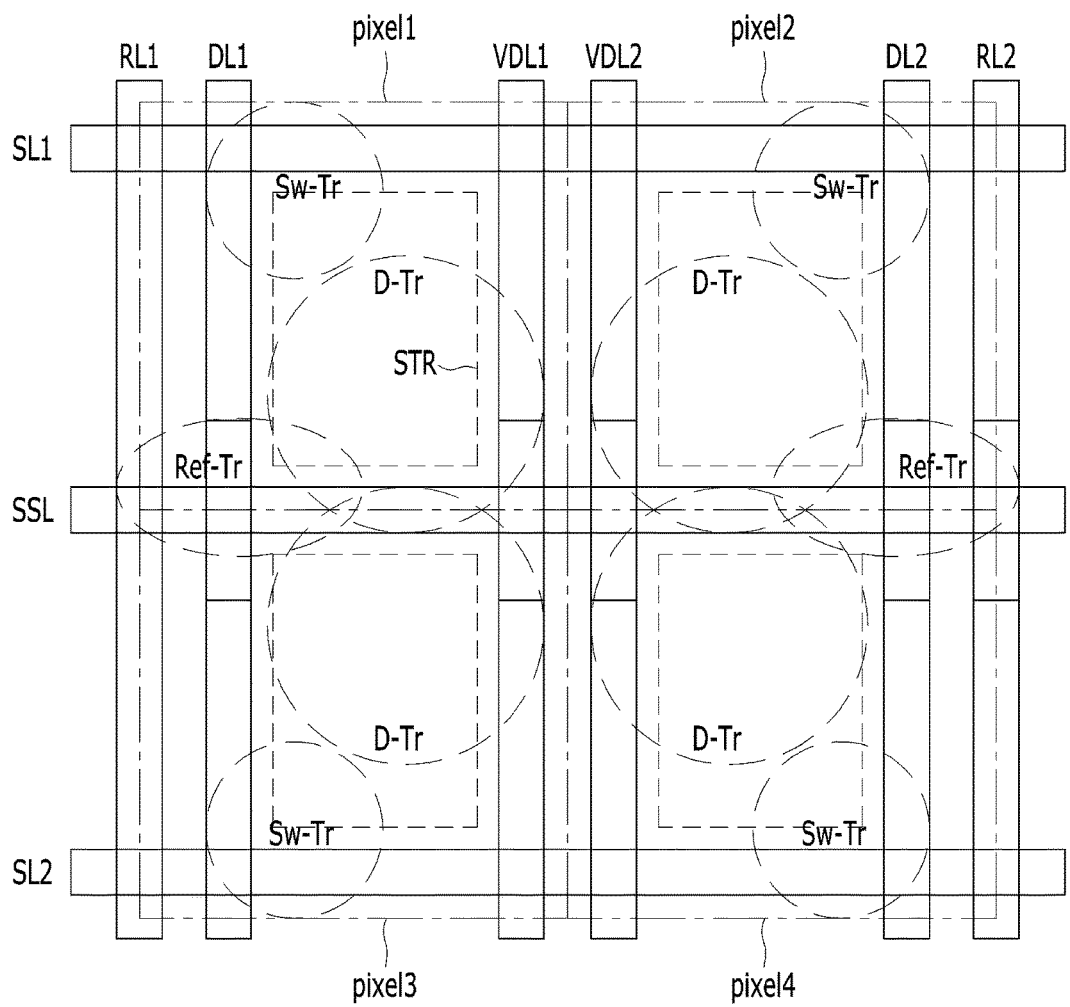

FIGS. 8A and 8B are schematic views illustrating various sub-pixel arrangements of the organic light emitting diode display in accordance with aspects of the present disclosure.

In a structure shown in FIG. 8A, two left and right sub-pixels, which are adjacent to each other in the horizontal direction, share second voltage lines provided in the vertical direction.

As exemplarily shown in FIG. 8A, two sub-pixels, which are adjacent to each other in the horizontal direction, are laterally reversed, i.e., are bilaterally symmetrical. In such a structure, first and second voltage lines are disposed at both sides of the left sub-pixel and the right sub-pixel, and the second voltage lines of the adjacent sub-pixels may be shared by the adjacent sub-pixels.

In a structure shown in FIG. 8B, four adjacent upper, lower, left and right sub-pixels share second voltage lines provided in the vertical direction and a sensing line.

As exemplarily shown in FIG. 8B, for example, if the left upper sub-pixel has a p-shape, the right upper sub-pixel has a laterally reversed shape, i.e., a q-shape, the left lower sub-pixel has a vertically reversed shape, i.e., a b-shape, and the right lower sub-pixel has a d-shape.

When lines are shared by adjacent sub-pixels, as such, a larger number of sub-pixels may be disposed in a smaller area and thus very high resolution may be achieved.

In such a structure having adjacent mirror-type sub-pixels, each sub-pixel may have a storage capacitor region STR, in the same manner as the structure shown in FIG. 2. Thereby, it is not necessary to allot a separate region of the sub-pixel so as to form storage capacitors and, thus, sufficient storage capacitance in a small area may be secured through parallel disposition of storage capacitors.

Further, as known from a description which will be given later, even if respective sub-pixels have reversed circuit configurations, organic light emitting diodes OLED of the respective sub-pixels are disposed at the same position, and particularly, at the same position of light emitting regions thereof, there is no deviation among the light emitting regions of the respective sub-pixels, and thus the organic light emitting diode display in accordance with the present disclosure may acquire uniformity in luminous efficacy according to regions.

Figure 9:
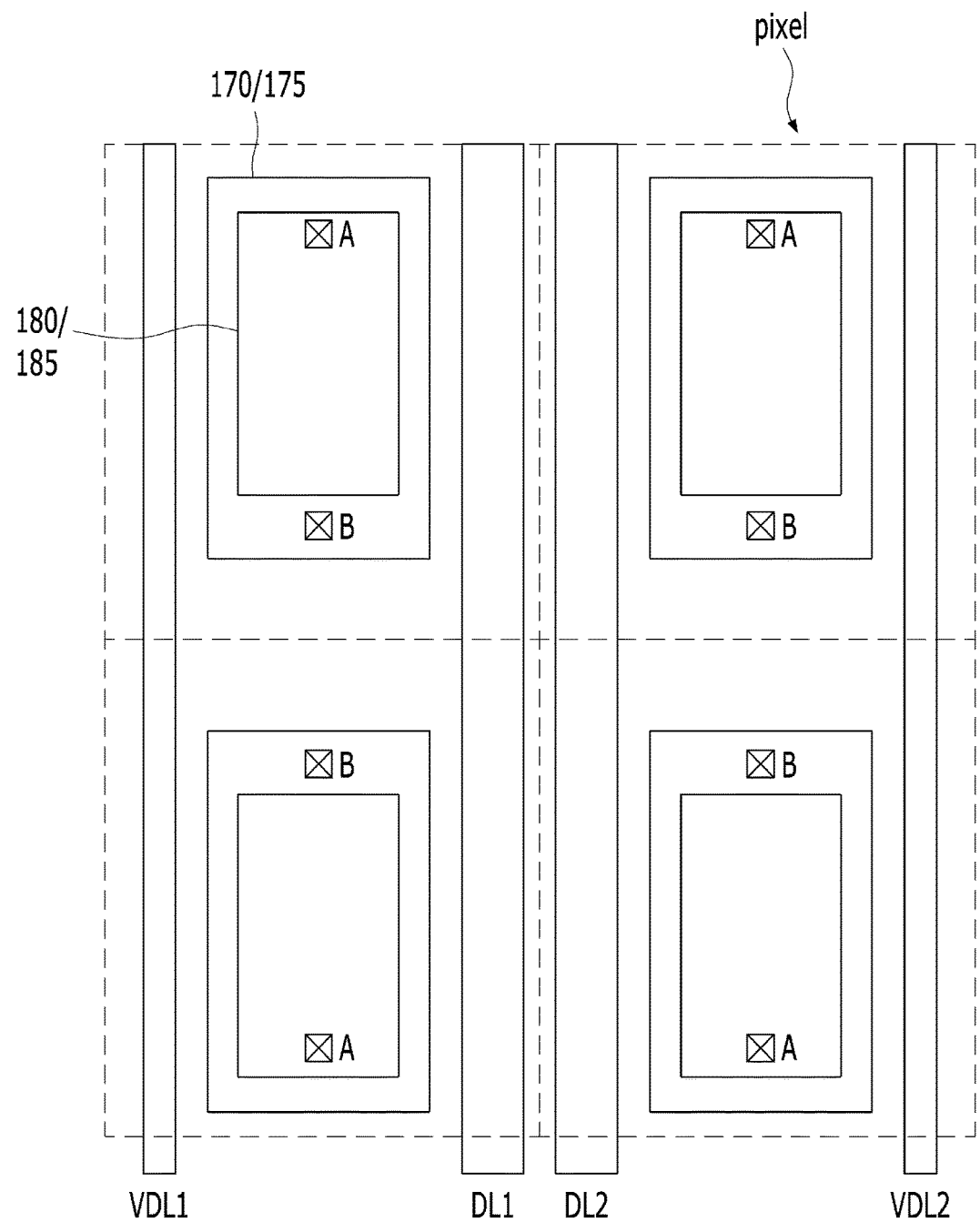
FIG. 9 is a plan view of a backplane substrate in accordance with one aspect of the present disclosure.
Figure 10A:
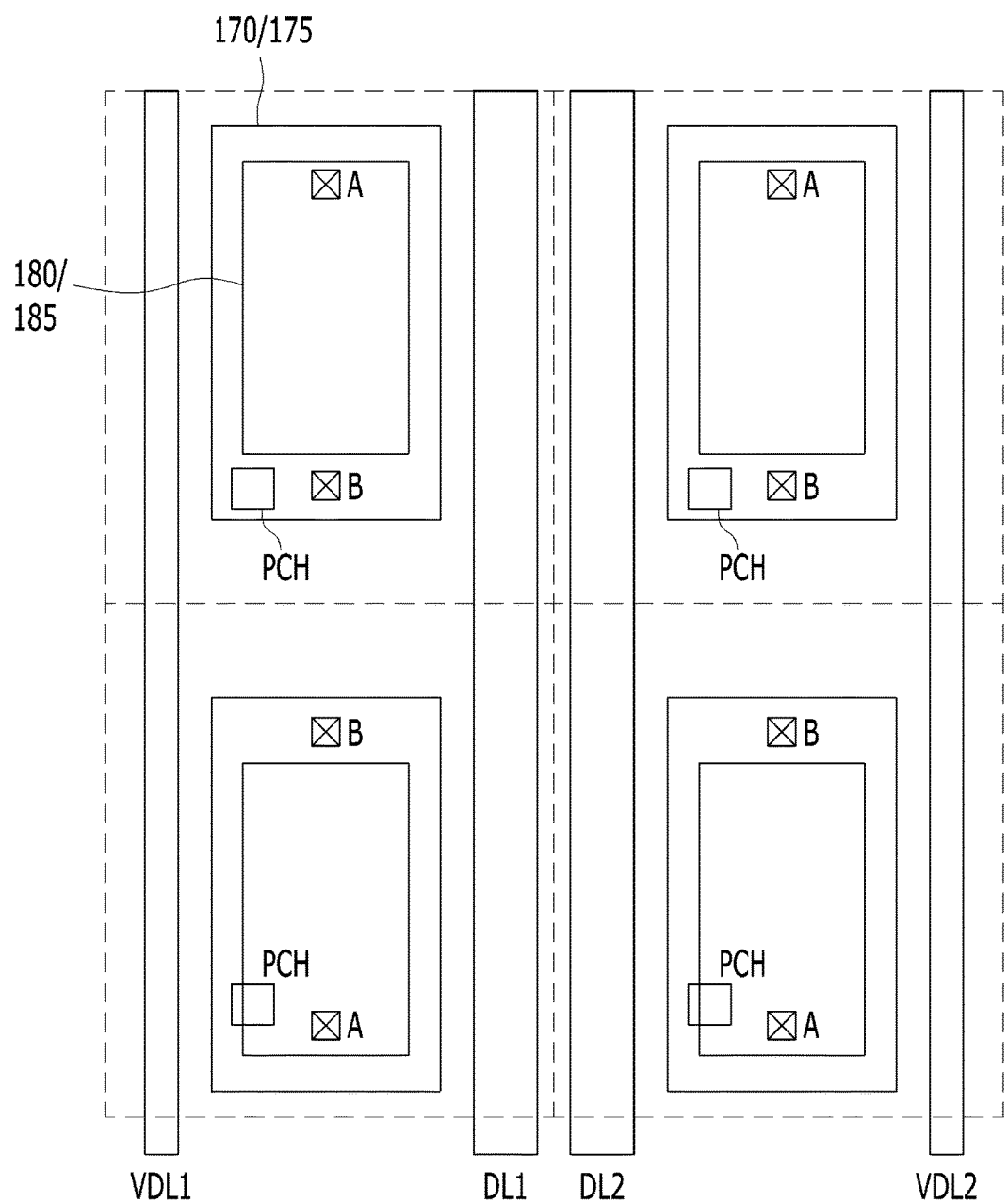
FIGS. 10A to 10C are plan views illustrating a method of manufacturing an organic light emitting diode display using the backplane substrate of FIG. 9.
Figure 10B:
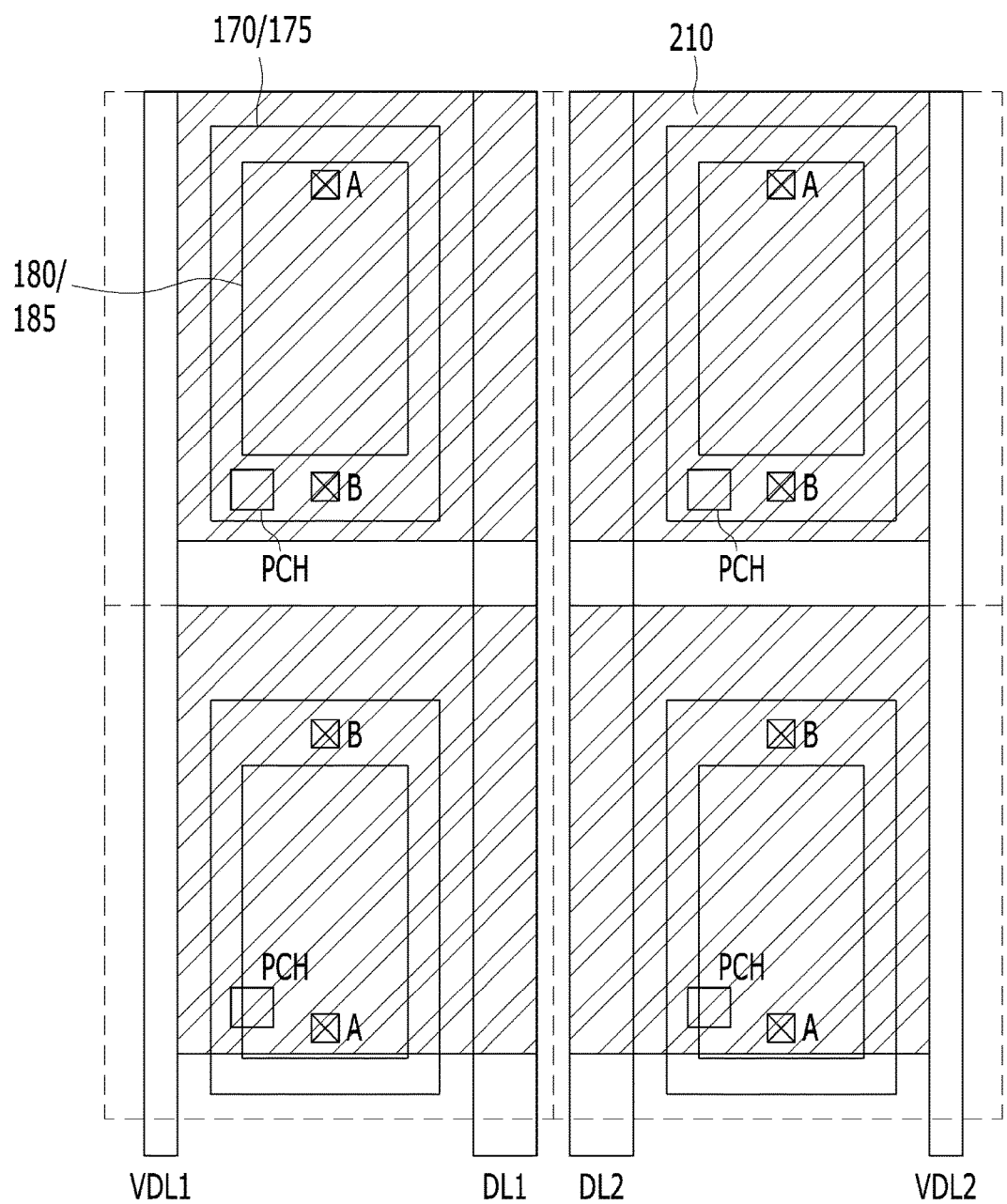
Figure 10C:
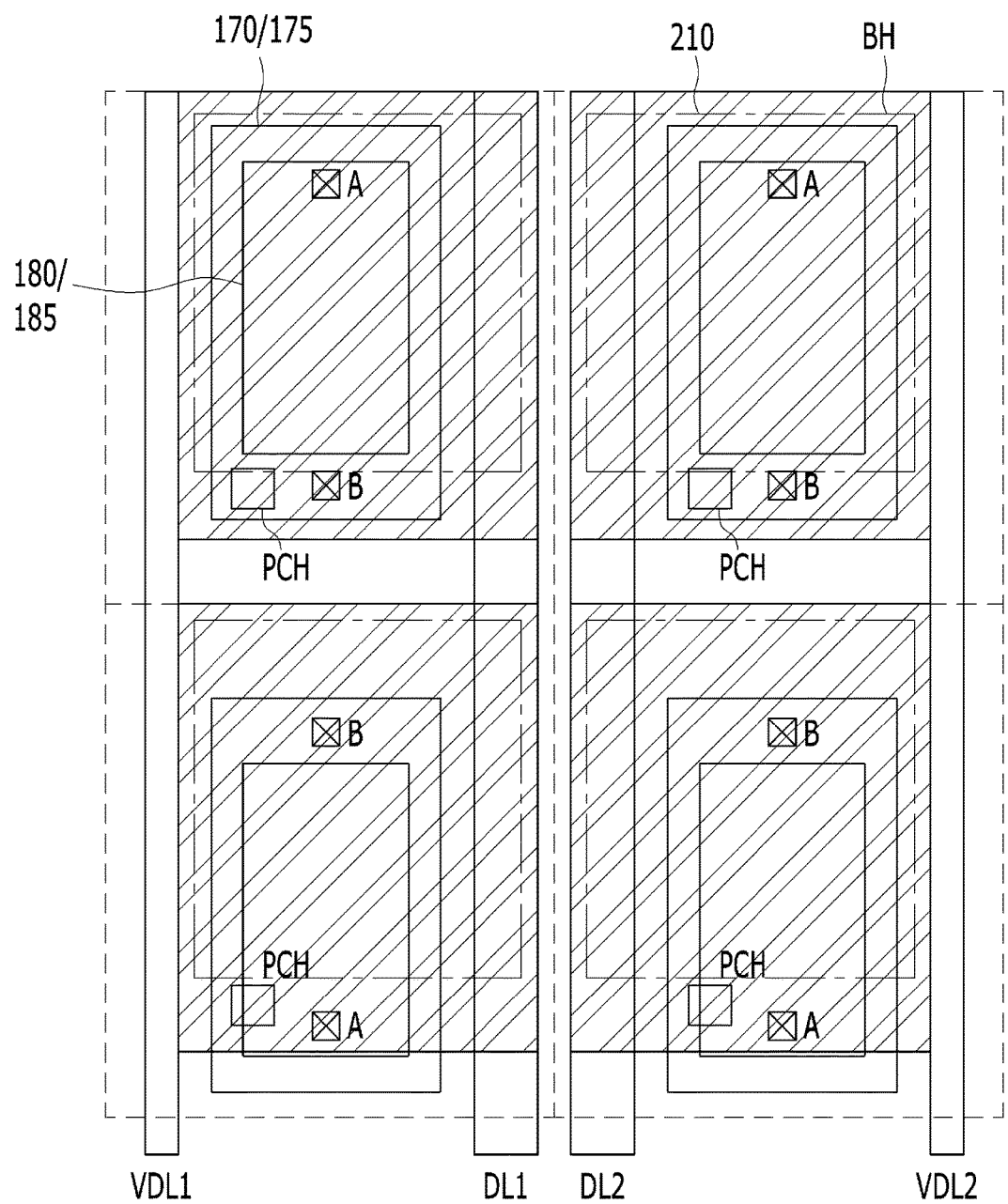

FIG. 9 is a plan view of a backplane substrate in accordance with one aspect of the present disclosure, and FIGS. 10A to 10C are plan views illustrating a method of manufacturing an organic light emitting diode display using the backplane substrate of FIG. 9.

As exemplarily shown in FIGS. 9 to 10C, after formation of the backplane substrate, planarization layer holes PCH are located at the same position in sub-pixels and, therefore, in order to display points at which bank holes are located so as to avoid the planarization layer holes PCH, wirings in the horizontal direction are omitted for convenience. However, as described above, the backplane substrate may further include wirings of scan lines and sensing lines.

As exemplarily shown in FIG. 9, in a structure in which four adjacent upper, lower, left and right sub-pixels share a sensing line and second voltage lines, first nodes A and second nodes B of respective storage capacitors in the adjacent sub-pixels are located at positions reversed to each other in a mirror type.

The planarization layer holes PCH of respective sub-pixels are located at the same position when the planarization layer 198 is formed, as exemplarily shown in FIGS. 10A and 7, an anode 120 contacts each first storage connection electrode 175 through the planarization layer hole PCH in each sub-pixel so as to completely cover the first storage connection electrode 175, as exemplarily shown in FIG. 10B, and, then, a bank 200 is formed so that the bank hole BH is provided on the first anode 210 except for the planarization layer hole PCH, as exemplarily shown in FIG. 10C. Thereby, a region defined as the bank hole BH is formed at the same position in each sub-pixel so as to have a sufficiently large size and, thus, a sufficient light emitting area may be acquired in the small-sized sub-pixels having high resolution. That is, the anode 210 covers the storage capacitor region STR so that capacitance transfer of storage capacitors Cst provided in parallel under the anode 210 is carried out throughout the storage capacitor region STR, and lower wirings are shielded by the anode 210 so that the lower wirings are not exposed to the top or observed from the top.

Thereafter, as exemplarily shown in FIG. 7, the organic layer 230 including the organic light emitting layer is formed on the anode 210 including the bank holes BH, and the cathode 240 is formed on the organic layer 230 throughout the active region including the sub-pixels.

Here, the anode 210, the organic layer 230 including the organic light emitting layer, and the cathode 240 form an organic light emitting diode OLED 200.

The cathode 240 is a transparent electrode and transfers light emitted from the organic layer 230 in the upward direction, and light reflected or refracted from the top and then entering the inside of the backplane substrate is reflected by the anode 210 and then used again to emit light.

In the above-described mirror-type structure shown in FIGS. 9 to 10C, even though adjacent upper, lower, left and right sub-pixels of the backplane substrate are reversed to have different shapes, planarization holes and bank holes are located at the same positions in the respective sub-pixels and thus uniform luminous characteristics may be acquired. If respective sub-pixels do not share wirings and thus individually include all wirings, as exemplarily shown in FIGS. 3 and 4, all sub-pixels of the backplane substrate have the same configuration and it is easy for organic light emitting diodes of all sub-pixels on the backplane substrate to have the same shape. Therefore, in this case, uniform luminous characteristics may be acquired without deviation according to the sub-pixels.

Hereinafter, characteristics of an organic light emitting diode display in accordance with the present disclosure will be described.

In a test below, characteristics of an organic light emitting diode display in accordance with comparative example, in which thin film transistors (a switching thin film transistor, a sensing thin film transistor and a driving thin film transistor) of each sub-pixel having the same top gate structure, are checked, and characteristics of an organic light emitting diode display in accordance with the present disclosure, in which a switching thin film transistor and a sensing thin film transistor of each sub-pixel have a top gate structure and a driving thin film transistor of each sub-pixel has a bottom gate structure, as exemplarily shown in FIG. 4, are checked.

Figure 11:
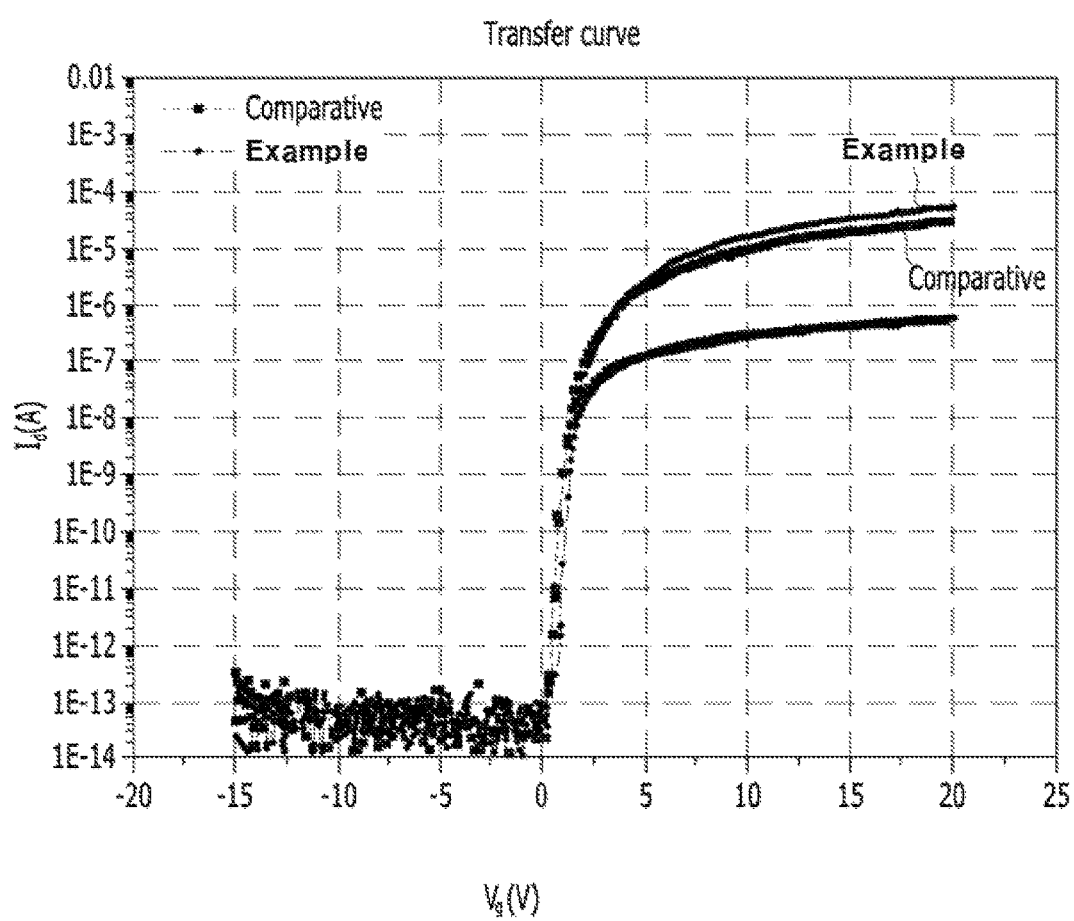
FIG. 11 is a graph illustrating transfer curve characteristics of thin film transistors of a backplane substrate in accordance with comparative example, in which the transistors of sub-pixels use the same gate structure, and transfer curve characteristics of thin film transistors of a backplane substrate in accordance with the aspect, in which the transistors of sub-pixels use different gate structures.

FIG. 11 is a graph illustrating transfer curve characteristics of the thin film transistors of the backplane substrate in accordance with comparative example, in which the transistors of sub-pixels use the same gate structure, and transfer curve characteristics of the thin film transistors of the backplane substrate in accordance with the preset disclosure, in which the transistors of sub-pixels use different gate structures.

With reference to FIG. 11, in both the structure in accordance with comparative example and the structure in accordance with the aspect of the present disclosure, driving current Id is linearly increased within the range of 0V-5V of gate voltage Vg and, thus, it is confirmed that both structures may achieve gradation expression as an organic light emitting diode display.

Figure 12:
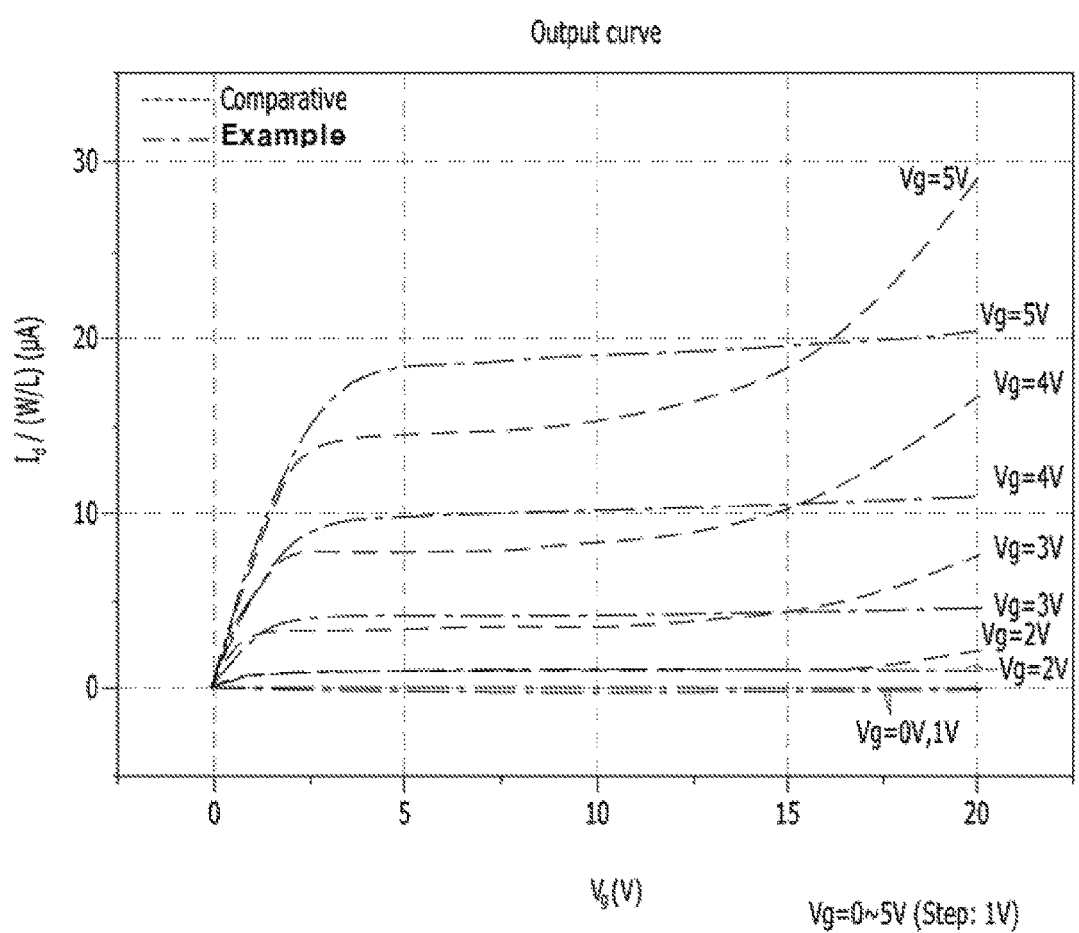
FIG. 12 is a graph illustrating output curve characteristics of thin film transistors of a backplane substrate in accordance with comparative example, in which the transistors of sub-pixels use the same gate structure, and output curve characteristics of thin film transistors of a backplane substrate in accordance with the preset disclosure, in which the transistors of sub-pixels use different gate structures.

FIG. 12 is a graph illustrating output curve characteristics of thin film transistors of a backplane substrate in accordance with comparative example, in which the transistors of sub-pixels use the same gate structure, and output curve characteristics of thin film transistors of a backplane substrate in accordance with the present disclosure, in which the transistors of sub-pixels use different gate structures.

With reference to FIG. 12, in both the structure in accordance with comparative example and the structure in accordance with the present disclosure, when output driving current Id at the second node is measured while gate voltage Vg of the driving thin film transistors is sequentially increased from 0V to 5V by 1V, the output driving current Id at the second node is increased as a voltage value applied to the first voltage line is increased. However, in the structure in accordance with the present disclosure, as applied voltage becomes higher, output driving current Id is gradually saturated and, on the other hand, in the structure in accordance with comparative example, as applied voltage is increased to 10V or higher, an increase range of driving current increases and characteristics of the diodes with respect to application of high voltage are not stable. That is, a backplane substrate and an organic light emitting diode display including the sub-pixel structure in accordance with the present disclosure include driving thin film transistors having stable driving characteristics and may thus have a circuit configuration which is stable even during driving for a long time and high-voltage driving.

If gate voltage Vg of the driving thin film transistor is 0V or 1V, change of voltage applied to the first voltage line scarcely influences driving current and this causes the same results in both the structure in accordance with comparative example and the structure in accordance with the present disclosure. This means that the driving thin film transistor is not normally turned on at a threshold voltage or lower of the driving thin film transistor and such an abnormal state is not considered in judgment of characteristics of the diodes and, in the structure in accordance with comparative example and the structure in accordance with the present disclosure, output driving currents just when gate voltage Vg of the driving thin film transistors is 2V or higher are considered as being meaningful.

The above-described backplane substrate, which has a small size of sub-pixels at high resolution and includes all circuit configurations to drive the sub-pixels within a limited sub-pixel area, maximally uses a region among provided wirings to form storage capacitors required for holding characteristics of the sub-pixels, and particularly, disposes a subsidiary storage capacitor in parallel to a main storage capacitor so as to overlap the main storage capacitor, thus being capable of acquiring sufficient total capacitance of the storage capacitors without influence on disposition of other thin film transistors in an allocated region having a limited area.

Further, the backplane substrate having the storage capacitors disposed in parallel is applicable to any display including storage capacitors and may thus be used in various types of displays requiring sufficient capacitance of sub-pixels having a limited area.

Moreover, in a structure having adjacent mirror-type sub-pixels, even though the respective sub-pixels have reversed circuit configurations, organic light emitting diodes OLED of the respective sub-pixels are disposed at the same position, and particularly, at the same position of light emitting regions thereof, there is no deviation among the light emitting regions of the respective sub-pixels, and thus an organic light emitting diode display in accordance with the present disclosure may acquire uniformity in luminous efficacy according to regions.

Subsequently, a backplane substrate and an organic light emitting diode display having the sub-pixel structure in accordance with the present disclosure include driving thin film transistors having stable driving characteristics and secure sufficient storage capacitance in sub-pixels having high resolution, thus having a circuit configuration having stable characteristics even during driving for a long time and high-voltage driving.

As apparent from the above description, a backplane substrate and an organic light emitting diode display using the same in accordance with the present disclosure have effects, as follows.

First, the backplane substrate, which has a small size of sub-pixels at high resolution and all circuit configurations to drive the sub-pixels within a limited sub-pixel area, maximally uses a region among provided metal lines to form storage capacitors required for holding characteristics of the sub-pixels, and particularly, disposes a subsidiary storage capacitor to overlap a main storage capacitor, thus being capable of acquiring sufficient total capacitance of the storage capacitors without influence on disposition of other thin film transistors in an allocated region having a limited area.

Second, the backplane substrate having the storage capacitors disposed in parallel is applicable to any display including storage capacitors and may thus be used in various types of displays requiring sufficient capacitance of sub-pixels having a limited area.

Third, among storage electrodes overlapping each other and located below semiconductor layers, a second storage electrode located at a relatively upper position is formed of a transparent metal oxide and, thus, during a process of defining a contact portion having storage capacitor electrodes (connection electrodes) in different layers provided above and below the semiconductor layers, the second storage electrode formed of the transparent metal oxide may protect a first storage electrode provided below the second storage electrode. Therefore, during the contact portion definition process, even if deep etching is required, short circuit between the first and second electrode electrodes may be prevented. Further, if the second storage electrode located just below the semiconductor layers is formed of the transparent metal oxide, surface roughness after deposition is reduced, as compared to a general metal, and, thus, crystallization characteristics of the semiconductor layers may be stabilized.

Fourth, in a structure having adjacent mirror-type sub-pixels, even though the respective sub-pixels have reversed circuit configurations, organic light emitting diodes OLED of the respective sub-pixels are disposed at the same position, and particularly, at the same position of light emitting regions thereof, there is no deviation among the light emitting regions of the respective sub-pixels, and thus an organic light emitting diode display in accordance with the present disclosure may acquire uniformity in luminous efficacy according to regions.

Fifth, a backplane substrate and an organic light emitting diode display having the sub-pixel structure in accordance with the present disclosure include driving thin film transistors having stable driving characteristics and provide sufficient capacitances of storage capacitors in sub-pixels having high resolution, thus having a circuit configuration having stable characteristics even during driving for a long time and high-voltage driving.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A backplane substrate for an organic light emitting display device, comprising:
    a substrate including a plurality of sub-pixels;
    a scan line disposed in a first direction at each sub-pixel;
    a first voltage line and a data line disposed in a second direction intersecting the first direction at each sub-pixel;
    a storage capacitor including a first storage electrode, a second storage electrode overlapping at least a portion of the first storage electrode, a second storage connection electrode overlapping the first and second storage electrodes and connected to the second storage electrode at a first node, and a first storage connection electrode overlapping the second storage connection electrode and connected to the first storage electrode at a second node, wherein there is a separation between the second node and the second storage electrode; and at least one semiconductor layer disposed between the first storage electrode and the first storage connection electrode or between the second storage electrode and the second storage connection electrode, and at least one of the first storage connection electrode and the second storage connection electrode penetrating through the at least one semiconductor layer.

2. The backplane substrate according to claim 1, wherein the at least one semiconductor layer comprising:

a first semiconductor layer configured such that the second storage connection electrode at the first node passes through the first semiconductor layer and is connected to a side surface of the first semiconductor layer; and a second semiconductor layer configured such that the first storage connection electrode at the second node passes through the second semiconductor layer and is connected to a side surface of the second semiconductor layer.

3. The backplane substrate according to claim 2, further comprising:

a switching thin film transistor including a switching gate electrode defined at a region of the scan line vertically overlapping the first semiconductor layer, and connected to the data line and the first node at both ends of the first semiconductor layer; and a driving thin film transistor including a driving gate electrode defined at a region of the second storage electrode vertically overlapping the second semiconductor layer, and connected to the second node and the first voltage line separated from the second storage electrode.

4. The backplane substrate according to claim 3, further comprising a sensing line disposed parallel to the scan line and a second voltage line disposed parallel to the data line at each sub-pixel, wherein the second semiconductor layer extends from the second node and is connected to the second voltage line.

5. The backplane substrate according to claim 4, further comprising a sensing thin film transistor including a sensing gate electrode defined at a region of the sensing line overlapping the second semiconductor layer, and connected to the second node and the second voltage line separated from the sensing line.

6. The backplane substrate according to claim 4, wherein the first storage electrode occupies about 50% to 100% of a storage capacitor region.

7. The backplane substrate according to claim 6, wherein upper and lower parts of the first storage electrode are adjacent to the scan line and the sensing line on the same plane and the left and right parts of the first storage electrode are adjacent to the data line and the first voltage line on the same plane.

8. The backplane substrate according to claim 5, wherein the first storage electrode, the second storage electrode, the first and second semiconductor layers, the scan line and the sensing line, the data line and the first and second voltage lines, the second storage connection electrode and the first storage connection electrode are sequentially disposed in order on the substrate.

9. The backplane substrate according to claim 8, further comprising:

a first insulating film between the first storage electrode and the second storage electrode;

a first gate insulating film between the second storage electrode and the first and second semiconductor layers;

a second gate insulating film between the first and second semiconductor layers and the scan and sensing lines;

a second insulating film between the scan and sensing lines and the data and first and second voltage lines;

a third insulating film between the data and first and second voltage lines and the second storage connection electrode; and a fourth insulating film between the second storage connection electrode and the first storage connection electrode.

10. The backplane substrate according to claim 9, wherein:

the first node has a first contact hole passing through the third insulating film, the second insulating film, the second gate insulating film, the first semiconductor layer and the first gate insulating film; and the second storage connection electrode fills the first contact hole and is connected to the second storage electrode.

11. The backplane substrate according to claim 10, wherein the second storage electrode includes a transparent metal oxide.

12. The backplane substrate according to claim 11, wherein the transparent metal oxide includes one of indium tin oxide (ITO), indium zinc oxide (IZO), indium tin zinc oxide (ITZO) and indium gallium zinc oxide (IGZO).

13. The backplane substrate according to claim 11, wherein the transparent metal oxide has a thickness of 1000 Å or less.

14. The backplane substrate according to claim 9, wherein:

the second node has a second contact hole passing through the fourth insulating film, the third insulating film, the second insulating film, the second gate insulating film, the second semiconductor layer, the first gate insulating film and the first insulating film; and the first storage connection electrode fills the second contact hole and is connected to the first storage electrode.

15. The backplane substrate according to claim 14, wherein the first storage electrode includes a light-shielding metal.

16. The backplane substrate according to claim 14, wherein the first storage electrode has a thickness of 1000 Å or less.

17. The backplane substrate according to claim 4, wherein the plurality of subpixels includes a first sub-pixel adjacent to a second sub-pixel, and the second voltage line is disposed between and shared by the first sub-pixel and second sub-pixel.

18. The backplane substrate according to claim 17, wherein the first sub-pixel and second sub-pixel are bilaterally symmetrical.

19. The backplane substrate according to claim 1, further comprising:

a storage capacitor region, including the storage capacitor, defined by intersecting the scan line, the first voltage line and the data line at each sub-pixel.

20. An organic light emitting diode display comprising:
a substrate including a plurality of sub-pixels;
a scan line disposed in a first direction at each sub-pixel;
a first voltage line and a data line disposed in a second direction intersecting the first direction at each sub-pixel;
a storage capacitor, at each sub-pixel, including a first storage electrode, a second storage electrode overlapping at least a portion of the first storage electrode, a second storage connection electrode overlapping the first and second storage electrodes and a first storage connection electrode overlapping the second storage connection electrode;
a first semiconductor layer, at each sub-pixel, configured such that the second storage connection electrode at the first node passes through the first semiconductor layer and is connected to a side surface of the first semiconductor layer, and a second semiconductor layer, at each sub-pixel, configured such that the first storage connection electrode at a second node passes through the second semiconductor layer and is connected to a surface of the second semiconductor layer, the first semiconductor layer and the second semiconductor layer being located between the second storage connection electrode and the second storage electrode; and
an organic light emitting diode including an anode connected to the second storage connection electrode, a cathode connected to a ground terminal, and an organic layer disposed between the anode and the cathode including a light emitting layer.

21. The organic light emitting diode display according to claim 20, further comprising:
a planarization layer, at each sub-pixel, on the first storage connection electrode and having a first contact hole exposing a part of the first storage connection electrode; and
a bank on the anode of each pixel, and having a bank hole located at a position different from the first contact hole.

22. The organic light emitting diode display according to claim 21, wherein:
the anode is connected to the first storage connection electrode through the first contact hole; and
the organic layer contacts the anode within the bank hole.

23. The organic light emitting diode display according to claim 22, wherein:
the first contact holes of the sub-pixels are located at the same position in the sub-pixels; and
the bank holes of the sub-pixels are located at the same position different from the first contact holes in the sub-pixels.

24. The organic light emitting diode display according to claim 23, wherein the anode covers a storage capacitor region.

25. The organic light emitting diode display according to claim 23, wherein the first node and the second node of a first sub-pixel has a mirror relationship to the first node and the second node of each of a remainder of sub-pixels adjacent to the first sub-pixel.

26. The organic light emitting diode display according to claim 20, further comprising a sensing line parallel to the scan line and a second voltage line parallel to the data line at each sub-pixel, wherein the second semiconductor layer extends from the second node and is connected to the second voltage line.

27. The organic light emitting diode display according to claim 26, further comprising a sensing thin film transistor including a sensing gate electrode defined at a region of the sensing line vertically overlapping the second semiconductor layer, and connected to the second node and the second voltage line separated from the sensing line.

28. The organic light emitting diode display according to claim 26, wherein the first storage electrode occupies about 50% to 100% of a storage capacitor region.

29. The organic light emitting diode display according to claim 28, wherein upper and lower parts of the first storage electrode are adjacent to the scan line and the sensing line on the same plane and the left and right parts of the first storage electrode are adjacent to the data line and the first voltage line on the same plane.

30. The organic light emitting diode display according to claim 20, further comprising:
a first insulating film between the first storage electrode and the second storage electrode;
a first gate insulating film between the second storage electrode and the first and second semiconductor layers;
a second gate insulating film between the first and second semiconductor layers and the scan line and sensing line;
a second insulating film between the scan line and sensing line and the data line and first and second voltage lines;
a third insulating film between the data line and first and second voltage lines and the second storage connection electrode; and
a fourth insulating film between the second storage connection electrode and the first storage connection electrode.

31. The organic light emitting diode display according to claim 30, wherein:
the first node has a first contact hole passing through the third insulating film, the second insulating film, the second gate insulating film, the first semiconductor layer and the first gate insulating film; and
the second storage connection electrode fills the first contact hole and is connected to the second storage electrode.

32. The organic light emitting diode display according to claim 31, wherein the second storage electrode includes a transparent metal oxide.

33. The organic light emitting diode display according to claim 20, further comprising:
a storage capacitor region, including the storage capacitor, defined by intersecting the scan line, the first voltage line and the data line at each sub-pixel.

34. The organic light emitting diode display according to claim 20, wherein the second storage connection electrode is connected to the first node, the first storage connection electrode is connected to the second node, and there is a separation between the second node and the second storage connection electrode.

35. The organic light emitting diode display according to claim 20, further comprising:
a switching thin film transistor including a switching gate electrode defined at a region of the scan line vertically overlapping the first semiconductor layer, and connected to the data line and the first node at both ends of the first semiconductor layer.

36. The organic light emitting diode display according to claim 20, further comprising:
- a driving thin film transistor including a driving gate electrode defined at the second storage electrode vertically overlapping the second semiconductor layer and connected to the second node, and the first voltage line separated from the second storage electrode.

37. A sub-pixel of a backplane substrate for a display device, comprising:
- a scan line and a sensing line spaced apart and parallel to each other;
- a first voltage line and a data line spaced apart and parallel to each other, intersecting the scan line and the sensing line;
- a storage capacitor region defined by the scan line, the sensing line, the first voltage line and the data line;
- first and second storage electrodes facing each other, disposed in the storage capacitor region, wherein the first storage electrode occupies at least 50% of the storage capacitor region and vertically overlapping at least a portion of one of the scan line, the sensing line, the first voltage line and the data line.

38. The sub-pixel according to claim 37, further comprising:
- a driving thin film transistor having a second semiconductor layer and the second storage electrode acting as a driving gate electrode disposed under the second semiconductor layer, and
- a switching thin film transistor having a first semiconductor layer and the scan line and the sensing line acting as a switching gate electrode disposed over the first and second semiconductor layers.

39. The sub-pixel according to claim 38, further comprising
- a sensing thin film transistor sharing the second semiconductor with the driving thin film transistor.

40. The sub-pixel according to claim 38, wherein the second storage electrode is connected at a first node and the first storage electrode is connected at a second node.

41. The sub-pixel according to claim 40, wherein the second node is located where there is a separation between the first and second storage electrodes.

* * * * *